US011177624B2

(12) United States Patent
Cheung et al.

(10) Patent No.: US 11,177,624 B2
(45) Date of Patent: Nov. 16, 2021

(54) TUNABLE LASER

(71) Applicant: Hewlett Packard Enterprise Development LP, Houston, TX (US)

(72) Inventors: Stanley Cheung, Palo Alto, CA (US); Michael Renne Ty Tan, Markham (CA); Wayne Sorin, Mountain View, CA (US); Joaquin Matres Abril, Palo Alto, CA (US); Sagi Mathai, Sunnyvale, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 42 days.

(21) Appl. No.: 16/588,370

(22) Filed: Sep. 30, 2019

(65) Prior Publication Data

US 2020/0203918 A1 Jun. 25, 2020

Related U.S. Application Data

(62) Division of application No. 15/642,752, filed on Jul. 6, 2017, now Pat. No. 10,439,357.

(51) Int. Cl.
*H01S 5/02* (2006.01)
*H01S 5/14* (2006.01)
(Continued)

(52) U.S. Cl.
CPC ............ *H01S 5/021* (2013.01); *H01S 3/1062* (2013.01); *H01S 5/02325* (2021.01); *H01S 5/1032* (2013.01); *H01S 5/142* (2013.01); *H01S 5/4062* (2013.01); *H01S 5/4068* (2013.01); *H01S 5/0064* (2013.01); *H01S 5/026* (2013.01); *H01S 5/0265* (2013.01); *H01S 5/0287* (2013.01); *H01S 5/101* (2013.01); *H01S 5/1014* (2013.01);
(Continued)

(58) Field of Classification Search
CPC .... H01S 5/021; H01S 5/02325; H01S 5/1032; H01S 5/142; H01S 5/4062; H01S 5/4068; H01S 5/0064; H01S 5/026; H01S 5/0265; H01S 5/0287; H01S 5/101; H01S 5/1014; H01S 5/227; H01S 5/3216; H01S 5/34306
See application file for complete search history.

(56) References Cited

U.S. PATENT DOCUMENTS 4,737,962 A   4/1988 Yamamoto et al.
5,333,219 A   7/1994 Kuznetsov
(Continued)

FOREIGN PATENT DOCUMENTS

CN    100463312 C    2/2009
EP    2544319 A1    1/2013

OTHER PUBLICATIONS

Chris Hessenius, "Novel Cavities and Functionality in High-power High Brightness Semiconductor Vertical External Cavity Surface Emitting Lasers," Jan. 31, 2017, 163 pages.
(Continued)

*Primary Examiner* — Michael Carter
(74) *Attorney, Agent, or Firm* — Hewlett Packard Enterprise Patent Department

(57) ABSTRACT

Examples of the present disclosure include a tunable laser comprising a waveguide including gain section. The waveguide overlies and is optically coupled to another waveguide. The another waveguide has a reflector at one end. A laser cavity is formed in the waveguides.

8 Claims, 19 Drawing Sheets

(51) Int. Cl.
  *H01S 3/106* (2006.01)
  *H01S 5/10* (2021.01)
  *H01S 5/40* (2006.01)
  *H01S 5/02325* (2021.01)
  *H01S 5/00* (2006.01)
  *H01S 5/028* (2006.01)
  *H01S 5/026* (2006.01)
  *H01S 5/227* (2006.01)
  *H01S 5/32* (2006.01)
  *H01S 5/343* (2006.01)

(52) U.S. Cl.
  CPC ............ *H01S 5/227* (2013.01); *H01S 5/3216* (2013.01); *H01S 5/34306* (2013.01)

(56) References Cited

U.S. PATENT DOCUMENTS

| | | |
|---|---|---|
| 6,980,720 B2 | 12/2005 | Gothoskar et al. |
| 8,615,025 B2 | 12/2013 | Dallesasse et al. |
| 9,270,078 B2 | 2/2016 | Rickman et al. |
| 2003/0007719 A1 | 1/2003 | Forrest et al. |
| 2010/0142567 A1* | 6/2010 | Ward ...................... H01S 5/141 372/20 |
| 2014/0153601 A1 | 6/2014 | Doerr et al. |
| 2015/0207296 A1 | 7/2015 | Rickman et al. |
| 2016/0134082 A1 | 5/2016 | Li et al. |
| 2017/0184787 A1 | 6/2017 | D'Agostino et al. |

OTHER PUBLICATIONS

G.H. Duan, "Integrated Hybrid III-V/SI Laser and Transmitter", IEEE, 39th International Symposium on Compound Semiconductors, Aug. 27-30, 2012, 6 pages.

He et al., "Tunable V-cavity Semiconductor Laser and Modules", Progress in Electromagnetics Research Symposium Proceedings, Guangzhou, China, Aug. 2014, pp. 333-336.

Hulme et al., "Widely tunable Vernier ring laser on hybrid silicon", 2013 Optical Society of America, 5 pages.

Quanan Chen, "Theory and Simulation of Multi-channel Interference (MCI) Widely Tunable Lasers," 2015, 12 pages.

Toru Segawa, "A Flat-output Widely Tunable Laser Based on Parallel-ring Resonator Integrated with Electroabsorption Modulator", Dec. 10, 2012, 8 pages.

* cited by examiner

TUNABLE LASER

BACKGROUND

A tunable laser is a laser for which the wavelength of output laser light can be varied in a controlled manner. Tunable lasers have many applications including as a variable source of light for wavelength division multiplexing (WDM) systems, spectroscopic measures, light detection and ranging and beam steering etc.

BRIEF DESCRIPTION OF THE DRAWINGS

Examples of the disclosure will now be described, by way of non-limiting example, with reference to the accompanying drawings, in which.

DETAILED DESCRIPTION

Figure 1:
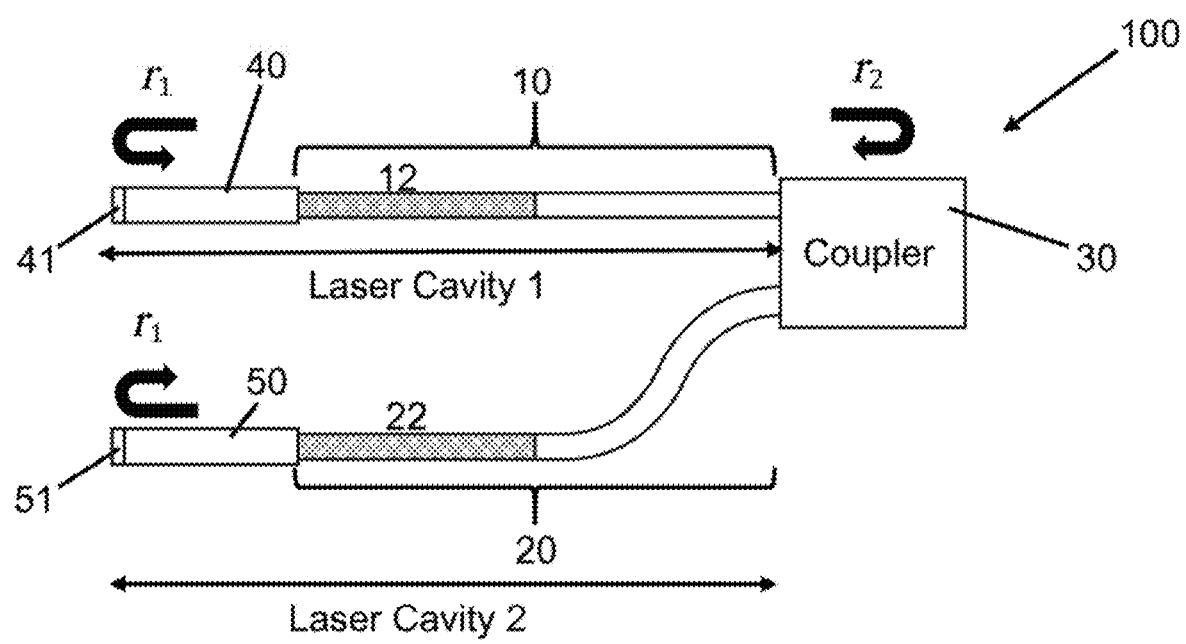
FIG. 1 is a schematic view of an example tunable laser according to the present disclosure.

For simplicity and illustrative purposes, the present disclosure is described by referring mainly to examples thereof. As used herein, the terms "includes" means includes but not limited to, the term "including" means including but not limited to. The term "comprises" means includes but not limited to, the term "comprising" means including but not limited to. The term "based on" means based at least in part on. The term "number" means any natural number equal to or greater than one. The terms "a" and "an" are intended to denote at least one of a particular element. Several examples and diagrams refer to layers of an assembly and their relative positions. The terms "positioned over" and "overlies" means positioned above and includes directly above and above with one or more layers in between. The terms "positioned under" and "underlies" mean positioned below and includes directly below and below with one or more layers in between. Where the present disclosure refers to layers, it is to be understood that each layer may itself comprise one or more sub-layers.

Photonic devices may include semiconductor materials. Silicon and certain other semiconductors have an indirect bandgap. An indirect band gap semiconductor is a semiconductor in which the maximum energy of the valence band occurs at a different value of momentum to the minimum energy of the conduction band. As such indirect bandgap semiconductors are suitable for constructing waveguides, gratings and mirrors, but are not optimum for the construction of light emitting devices.

Certain photonic devices, especially lasers and other light producing devices, are best implemented using direct bandgap semiconductors. A direct bandgap (DBG) semiconductor is a semiconductor in which the maximum energy of the valence band and the minimum energy of the conduction band occur at the same value of momentum. Group III-V semiconductors are one example of direct bandgap semiconductors. A Group III-V semiconductor is a semiconductor including at least one element from Group III or Group V of the Periodic Table. In some examples, Group III-V semiconductors may be compound semiconductors, which are semiconductors composed of two or more elements. A quaternary semiconductor is a semiconductor composed of four elements.

In general, the manufacturing lines for forming group III-V semiconductor devices may be kept separate from the manufacturing lines for indirect bandgap semiconductors such as silicon. This is because III-V semiconductors may contaminate silicon wafer manufacturing facilities causing problems in the silicon manufacturing process. A hybrid laser is a laser for which the laser cavity includes both III-V and silicon materials. It can be difficult to manufacture hybrid lasers because of the above mentioned incompatibility between III-V and silicon production lines. Thus one approach to manufacturing a hybrid laser is to bond a III-V gain section to a silicon waveguide.

A widely tunable laser is a tunable laser for which the output wavelength can be varied in a controlled manner over a significant range, for example at least a difference of 10 nm and in some cases a difference of 40 nm or more between the lowest wavelength and the highest wavelength. The tuning may be discrete between a number of predetermined wavelengths within said range or may be continuous between the upper and lower bounds of the range. It would be desireable to have a tunable laser with a wide range of tunability, high side mode suppression ratio (SMSR), a small footprint and simple fabrication.

FIG. 1 shows a schematic view of a tunable laser 100 according to an example of the present disclosure. In one example, the tunable laser 100 may be formed on a single chip comprising group III-V semiconductor materials. The tunable laser 100 is thus a III-V semiconductor laser in which the laser cavities are formed of III-V semiconductor materials. The laser cavities of the tunable laser 100 do not include a silicon waveguide. Thus, the tunable laser 100 is not a hybrid laser, as a hybrid laser is a laser in which the laser cavity includes both Si and III-V materials.

The tunable laser 100 includes a first laser cavity 1 and a second laser cavity 2. The first laser cavity 1 includes a first III-V waveguide 10 which comprises a first III-V semiconductor material. The first waveguide 10 is optically coupled to a third III-V waveguide 40 which comprises a third III-V semiconductor material. The second laser cavity 2 includes a second III-V waveguide 20 which comprises a second III-V semiconductor material. The first III-V semiconductor material may be the same as the second III-V semiconductor material. The second waveguide 20 is optically coupled to a fourth III-V waveguide 50 which comprises a fourth III-V semiconductor material. The third III-V waveguide 40 may form a waveguide part of a mode converter, likewise the fourth III-V waveguide 50 may form a waveguide part of a mode converter. In the context of this disclosure a mode converter is a device which changes the size of an optical mode of light propagating in the laser cavity. An optical mode is the spatial distribution of light within a waveguide and the size of an optical mode is the area occupied by the light in a plane normal to the direction of propagation. Light propagating along the first III-V waveguide 10 may have a first size of optical mode and may be coupled from the first III-V waveguide 10 to the third III-V waveguide 40. In the third waveguide 40, the light may adopt a second size of optical mode which is larger than the first size of optical mode. Likewise for the second III-V waveguide 20 and the fourth waveguide 50.

In one example the third and fourth waveguides 40, 50 have larger widths than the respective widths of the first and second III-V waveguides 10, 20. The conversion of light to a larger mode may occur as a result of the coupling of light from the first or second waveguide 10, 20 to the larger third or fourth waveguide 40, 50 below. In one example these waveguides 40, 50 are diluted waveguides comprising alternating layers of a relatively high refractive index material and a relatively low refractive material.

The first III-V waveguide 10 includes a first gain section 12, while the second III-V waveguide 20 includes a second gain section 22. A gain section is a section which is to generate or amplify light. For example, the gain section may generate or amplify light in response to application of an electrical current. At least one of the first laser cavity 10 and the second laser cavity 20 is tunable. Tunable means that the wavelength(s) of light amplified by the gain section of the laser cavity may be adjusted in a controlled manner. In one example, the first and/or second gain sections are tunable and tuning of the first and/or second laser cavity may be achieved by tuning of the first and/or second gain sections.

The first III-V waveguide 10 is connected at a first end to a III-V optical coupler 30 and optically coupled at a second end to the third waveguide 40. The third waveguide includes a first reflector 41. The second III-V waveguide 20 is connected at a first end to the III-V optical coupler 30 and optically coupled at a second end to the fourth waveguide 50. The fourth waveguide 50 includes a second reflector 51. The III-V optical coupler may comprise a III-V semiconductor material, which may be the same as the first and/or second III-V semiconductor material.

In the context of this disclosure, the term connected means that light may propagate directly—e.g. from the first III-V waveguide 10 to the optical coupler 30. The term "optically coupled" means that light may transfer between two separate waveguides—e.g. from the first III-V waveguide 10 to the third waveguide 40 via an optical coupling mechanism between the waveguides, or from the first III-V waveguide 10 to the second III-V waveguide 20 via the optical coupler 30.

It will be appreciated from the above structure, that the first laser cavity 1 is terminated at one end by the III-V optical coupler 30 and at the other end by the reflector 41. Likewise, the second laser cavity 2 is terminated at one end by the III-V optical coupler 30 and at the other end by the reflector 51. Thus light may be reflected within the laser cavities as shown by the arrows $r_1$ at the reflector ends and as shown by the arrow $r_2$ at the optical coupler end. The arrow $r_1$ denotes reflection by the reflectors 41, 51 of the third and fourth waveguides, while the arrow $r_2$ denotes reflection by the optical coupler 30 or coupling of light between the first laser cavity 1 and second laser cavity 2 via the optical coupler 30.

The first laser cavity may have a first free spectral range (FSR), while the second laser cavity may have a second free spectral range (FSR) which is different to the first FSR. The FSR of a laser cavity is the spacing between successive resonant wavelengths within the laser cavity. As the first laser cavity 1 is optically coupled to the second laser cavity 2 via the optical coupler 30 and as the first laser cavity 1 and the second laser cavity 2 have different FSRs, this may give rise to a Vernier effect that facilitates precise tuning of an output wavelength of the laser.

The tunable laser 100 may be formed on a photonics integrated chip. Photonic integrated chips may be produced cheaply, at high volume and to a reliable quality using semiconductor manufacturing techniques adapted from the semiconductor electronics industry. As the tunable laser 100 may be formed of III-V materials and is not a hybrid laser, the entire laser may be formed on a single III-V chip. This makes the manufacturing process simple as unlike a hybrid laser, it is not necessary to process and patter III-V and silicon sections separately. Furthermore, as the tunable laser does not include silicon in the laser cavity, it is possible to manufacture multiple tunable lasers on the same III-V wafer and then subsequently separate the wafer into a plurality of tunable laser dies. This makes it possible to manufacture at scale in an efficient process.

Figure 2:
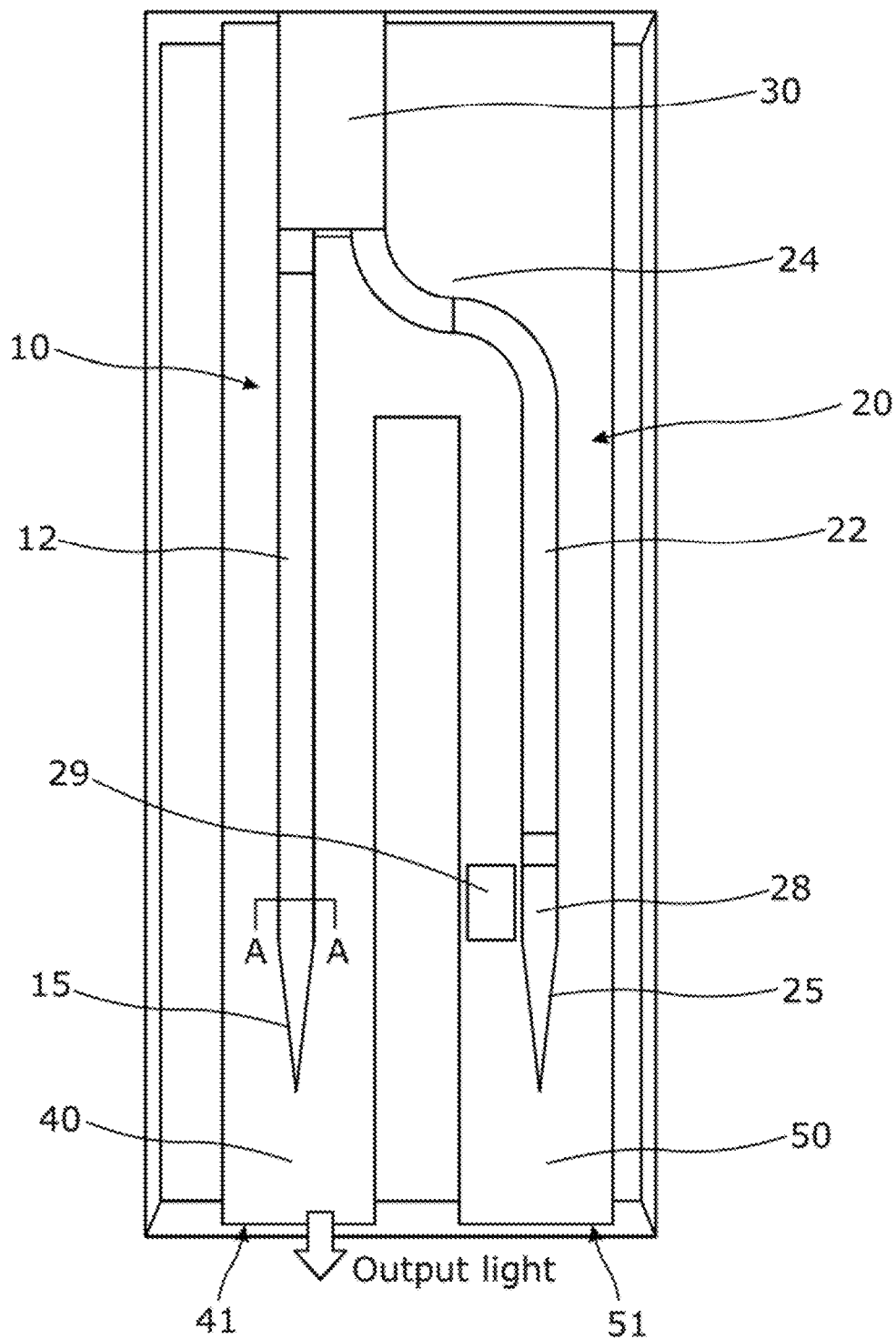
FIG. 2 is a top-down view of an example tunable laser according to the present disclosure.
Figure 3A:
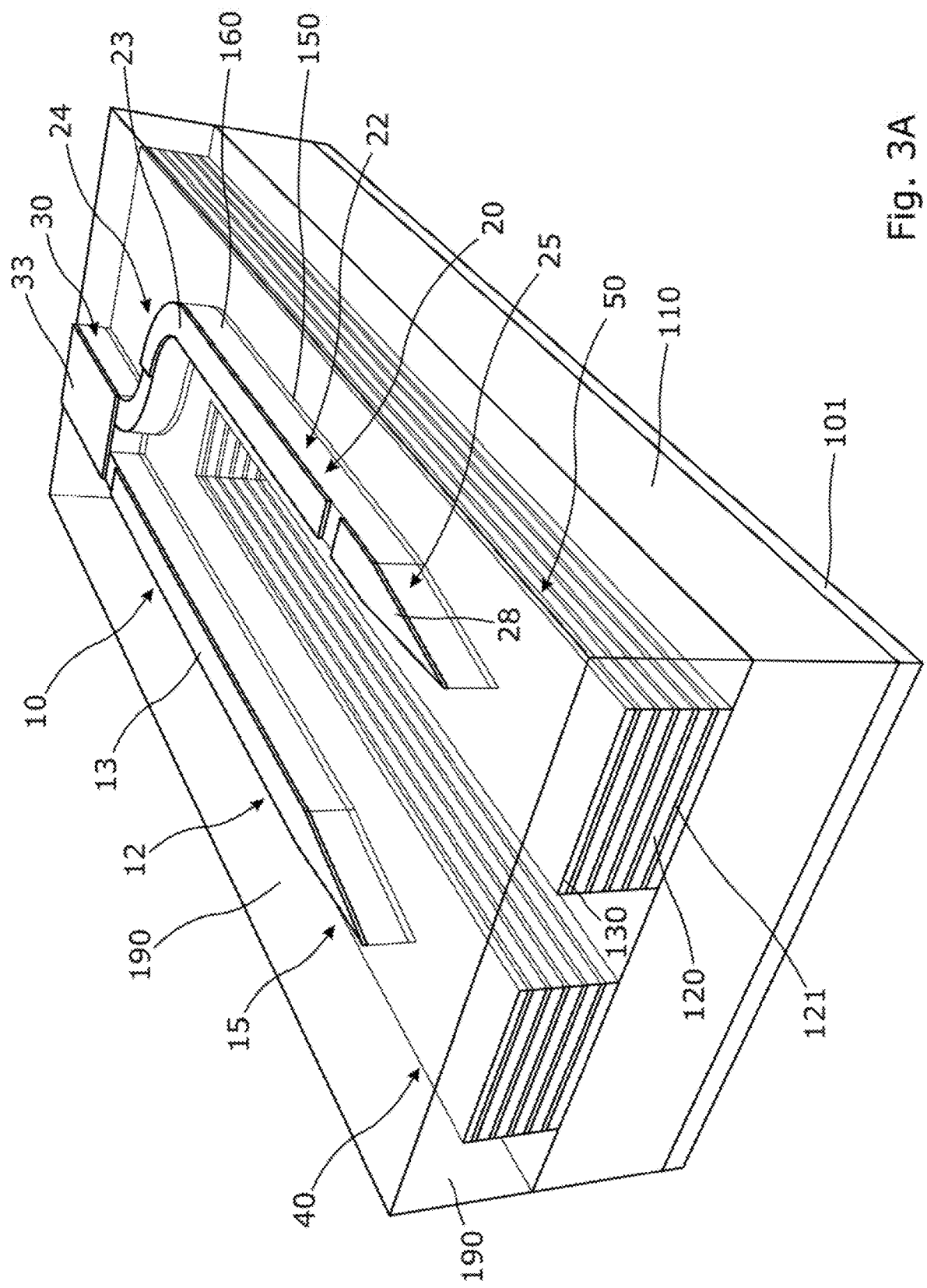
FIG. 3A is a perspective view of an example tunable laser according to the present disclosure.

FIG. 2 shows a top-down view of an example photonics integrated chip providing a tunable laser having a structure similar to that shown schematically in FIG. 1. FIG. 3A is a perspective view from above of the laser of FIG. 2. The tunable laser may have a relatively small foot print. In one example an area occupied by the tunable laser shown in FIG. 2 may be 500 μm×200 μm or less.

As can be seen in FIGS. 2 and 3, the tunable laser includes a pair of III-V waveguides 10, 20 that overlie a third and fourth waveguides 40, 50 to form a tunable laser 100. The first III-V waveguide 10 overlies the third waveguide 40, while the second III-V waveguide 20 overlies the fourth waveguide 50. The third waveguide 40 has a greater width than a width of the first waveguide 10. The fourth waveguide 50 has a greater width than a width of the first waveguide 20. The third and fourth waveguides may underlie the optical coupler 30 as well. In the context of this disclosure, the width of a waveguide is the extent of the waveguide in a direction perpendicular to the direction or propagation of light in the waveguide and parallel to a plane below the waveguide. E.g. the width is in the direction left to right in FIG. 2.

As the third waveguide 40 has a larger width (and also larger cross sectional area) than the first waveguide 10, the third waveguide 40 is able to contain a larger optical mode compared to the first waveguide. A coupling mechanism, such as a taper transition tip 15 discussed later, may couple light from the first waveguide to the third waveguide. As the third waveguide has a larger width the coupled light adopts a large optical mode in the third waveguide. The coupling mechanism together with the third waveguide 40 therefore acts as a mode converter that converts an optical mode in the first waveguide 10 to a larger optical mode in the third waveguide 40. This larger optical mode may make it easier to couple light from the laser to other external optical components. Likewise, the fourth waveguide 50 may contain a larger optical mode than the second waveguide 20. The fourth waveguide 50 together with a coupling mechanism, such as a taper transition tip of the second waveguide, may act as a mode converter that converts an optical mode in the second waveguide 20 to a larger optical mode in the fourth waveguide 50.

The third and fourth waveguides 40, 50 may be diluted waveguides. A diluted waveguide is a waveguide which comprises a core including alternating layers of different refractive index materials. An effective refractive index of the diluted waveguide is thus a spatial average of the refractive indexes of the alternating layers. Referring to the example of FIG. 3A, the third waveguide 40 may comprise alternating first and second layers 121, 120. The first alternating layer 121 may comprise a third III-V semiconductor material which may have a refractive index which is higher than a refractive index of the second alternating layer 120 which comprises a fifth III-V semiconductor material. The fourth waveguide 50 may have a similar structure with a first alternating layer comprising a fourth III-V semiconductor material having a higher refractive index than a second alternating layer comprising a sixth III-V semiconductor material. As will be explained later, this structure helps to draw light into the mode converter and expand the mode of the light.

The third III-V semiconductor material of the third waveguide 40 may be the same as the fourth III-V semiconductor material of the fourth waveguide 50. Likewise, the fifth III-V semiconductor material of the third waveguide 40 may be the same as the sixth III-V semiconductor material of the fourth waveguide 50. In some examples, the fifth III-V semiconductor material of the third waveguide 40 may be the same as the first III-V semiconductor material of the first waveguide 10; likewise the sixth III-V semiconductor material of the fourth waveguide 50 may be the same as the second III-V semiconductor material of the second waveguide 20.

As shown in FIG. 3A, the tunable laser may include a first electrically conductive layer 101, which may for example be formed of a metal. A substrate 110 overlies the first conductive layer. The substrate 110 may comprise a III-V semiconductor material, such as InP. The third and fourth waveguides 40, 50 may overlie the substrate 110. The third waveguide 40 and the fourth waveguide 50 may be connected together and may form an integral piece together with a section underlying the optical coupler 30. In the illustrated example, the third and fourth waveguides 40, 50 together form a U-shape.

The optical coupler 30 may for example be a multimode-interference coupler, a directional coupler or other type of coupler. The optical coupler 30 may include an electrical contact, such as metal layer, 33 on top of the optical coupler. The optical coupler may be controlled by applying a potential difference between the metal contact 33 and the first conductive layer 101 at the bottom of the tunable laser.

Referring to FIG. 2, the first III-V waveguide 10 includes a first gain section 12 which may amplify light passing through it. Likewise the second III-V waveguide 20 includes a second gain section 22 which may amplify light passing through it. For instance the gain sections may comprise an optically active laser material, a quantum well, multiple quantum well (MQW) or quantum dots etc.

Referring to FIG. 3A, each of the first III-V waveguide 10, the second III-V waveguide 20 and the optical coupler 30 may include an upper cladding layer 160 and an active layer 150 which is positioned between the upper cladding layer 160 and lower cladding layer 130. In the illustrated example, the lower cladding layer 130 is an upper part of the third and fourth waveguides 40, 50 which underlie the first and second III-V waveguides 10, 20. However, in other examples the lower cladding layer 130 may be part of the first and second waveguides 10, 20.

In the example shown in FIG. 3A, the first III-V waveguide 10, the second III-V waveguide 20 and the optical coupler 30 are integral parts of the same III-V structure, such that the active layer 150 and upper cladding layer 160 extend through all three parts. The active layer 150 may include an optically active laser material, quantum well, multiple quantum well (MQW) or quantum dots etc. The active layer may generate or amplify light in response to application of an electric current. Meanwhile, the upper and lower cladding layers 160, 130 may at least partially confine light photons within the active layer 150.

In one example the upper cladding layer 160 and lower cladding layer 130 may comprise InP and the active layer 150 may comprise AlInGaAs. In another example, the upper cladding layer and the lower cladding layer may comprise InP and the active layer may comprise InGaAsP.

As mentioned above, in the example of FIG. 3A, the lower cladding layer 130 is actually formed by the third and fourth waveguides 40, 50. That is the layer 130 is an upper layer of the third and fourth waveguides 40, 50 but acts as a lower cladding layer of the first and second III-V waveguides 10, 20.

An electrical contact 13 may overlie the first gain section 12 of the first III-V waveguide. The electrical contact 13 may comprise a metal. A potential difference may be applied between the electrical contact 13 and the electrically conductive layer 101 so as to drive electrical current through the first gain section 12 and stimulate optical gain. Likewise, an electrical contact 23 may overlie the second gain section 22 of the second III-V waveguide 20. Electrical current may be passed through the second gain section 22 so as to stimulate optical gain by applying a potential difference between the electrical contact 23 and the lower electrically conductive layer 101.

As can be seem from FIGS. 2 and 3, the electrical contact 13 of the first gain section and the electrical contact 23 of the second gain region are electrically isolated from each other and from the electrical contact 33 of the optical coupler. Thus, the first gain section 12, second gain section 22 and the optical coupler 30 may be controlled independently of each other.

Further, one of the first and second III-V waveguides may include an amplitude modulator (28), such as an electroabsorption modulator, Mach Zehnder modulator, or separate laser gain section. An electro-absorption modulator (EAM) is a device which can be used to modulate the intensity of a laser beam via an electric voltage. For example, an EAM may include electrodes for applying an electric field across the waveguide which carries the laser beam which is to be modulated. The applied electric field changes the bandgap and thus the absorption spectrum of the waveguide. The electric field applied by the EAM includes at least a component in a direction perpendicular to the direction of propagation of the laser beam.

Figure 3B:
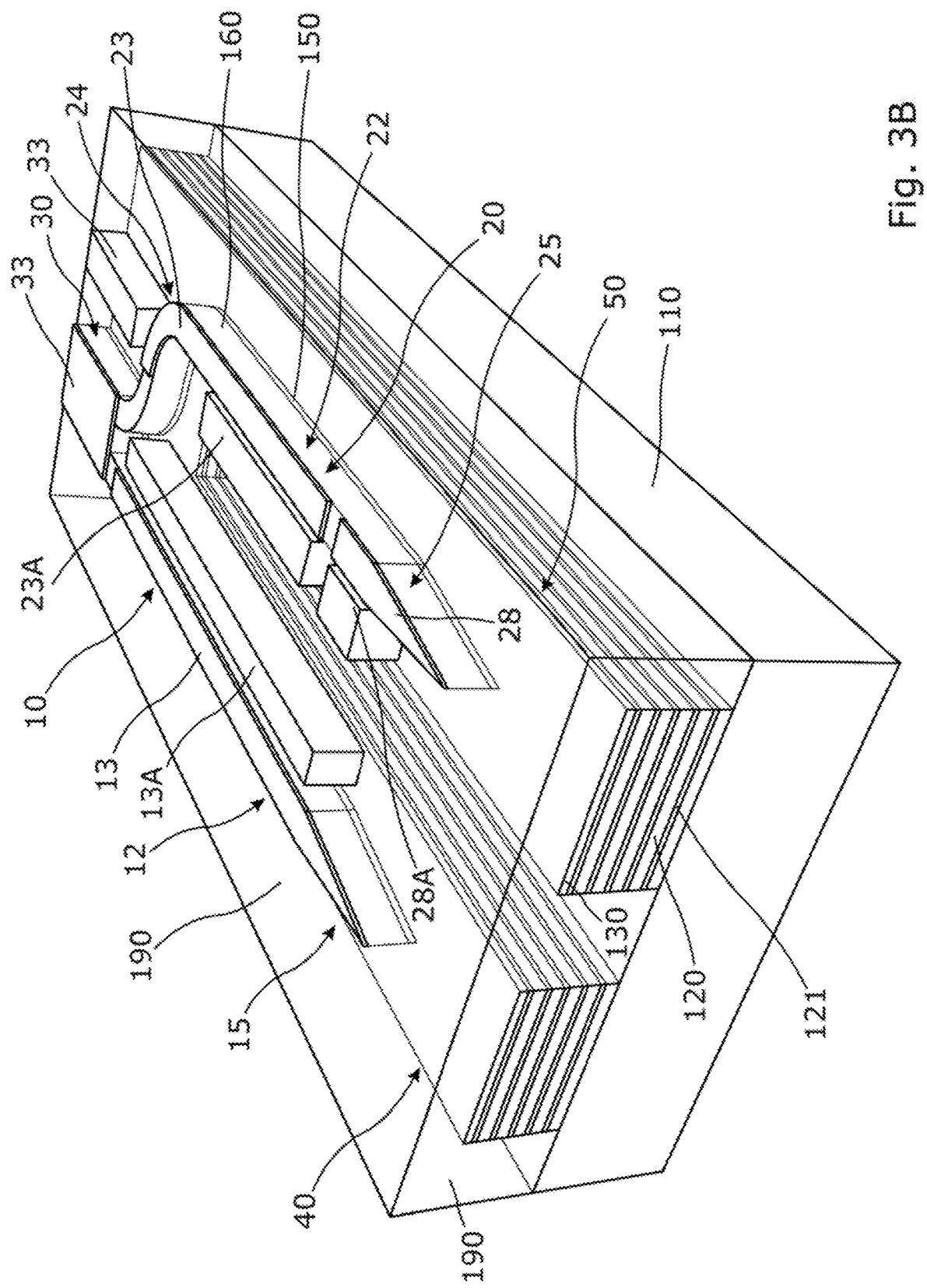
FIG. 3B is a perspective view similar to FIG. 3A, but showing a different arrangement of electrodes.

In the example of FIGS. 2 and 3 the second III-V waveguide 20 includes an EAM. The EAM includes an electrode 28. An electric field may be applied between the electrode 28 and the electrical contact 101. For example, the electrode 28 may be an electrical contact overlying the upper cladding layer 160 of the second III-V waveguide. The electrode 28 may comprise a metal. By applying an electrical field between the first electrode 28 and the electrode 101, the power of light in the laser cavity and thus the power of the laser beam emitted by the tunable laser may be modulated. While in the example shown in FIG. 3A, the electrical contact 101 is at the bottom of the structure and may act as a common ground electrode opposite the electrodes 13, 23, 33 and 28, other arrangements are possible. For example, as shown in FIG. 3B, instead of a common electrical contact 101 at the bottom, there may be four separate electrodes 13A, 23A, 33A and 28A on the top of the third and fourth waveguides and adjacent the electrodes 13, 23, 33 and 28 respectively. Thus for example, a potential difference could be applied between the electrode 28 and the electrode 28A mounted on top of the fourth waveguide and adjacent the electrode 28. Likewise, a potential difference could be applied between the electrode 13 (which is on top of the first gain section) and the electrode 13A on top of the third waveguide and adjacent the first gain section. Likewise a potential difference could be applied between the electrodes 23 and 23A and the electrodes 33 and 33A.

In the example of FIGS. 2, 3A and 3B, the EAM is positioned towards one end of the second gain section 22 just before a taper transition tip 25, which tip 25 is discussed in more detail below. The electrical contact 28, which is positioned on top of the second III-V waveguide, is electrically isolated from the electrical contact 23 which overlies a main region of the second gain section 22. That is the upper cladding layer 160 and active layer 150 extend continuously between the EAM section and the gain section, but there is a gap between the electric contact 28 and the electrical contact 23.

While the EAM has been shown in the second III-V waveguide 20 in FIGS. 2, 3A and 3B, in other examples the first III-V waveguide 10 could include the EAM, or both first and second III-V waveguides could include a respective EAM.

There are respective optical coupling mechanisms to optically couple the first III-V waveguide 10 to the third waveguide 40 and to optically couple the second III-V waveguide 20 to the second fourth waveguide 50.

In the example shown in FIGS. 2, 3A and 3B the optical coupling mechanism is a taper transition tip of the III-V waveguide. For instance, each III-V waveguide has a taper region which gradually narrows in width towards a tip at the end of the waveguide. Thus the first III-V waveguide 10 includes a first taper transition tip 15 to optically couple light from the first III-V waveguide to the third waveguide 40. The second III-V waveguide 20 includes a second taper transition tip 25 to optically couple light from the second III-V waveguide 20 to the fourth waveguide 50.

In one example, the first gain section 12 of the first III-V waveguide has a width at least three times larger than a width of the tip of the first taper transition tip 15 and the second gain section 22 of the second III-V waveguide has a width at least three times larger than a width of the tip of the second taper transition tip 25. In this context, the tip of a taper transition tip is the width of the tip at the narrowest point of the tip. In another example, the first gain section 12 of the first III-V waveguide has a width at least five times larger than a width of a tip of the first taper transition tip 15 and the second gain section 22 of the second III-V waveguide has a width at least five times larger than a tip of the second taper transition tip 15.

Also as mentioned above, the third and fourth waveguides 40, 50 have widths larger than the first and second III-V waveguides 10, 20. In one example the width of the third waveguide 40 is at least one and a half times the width of the first III-V waveguide. Likewise for the fourth waveguide and the second III-V waveguide. In another example, the width of the third waveguide 40 is at least double the width of the first III-V waveguide. Likewise for the fourth waveguide and the second III-V waveguide. In this context, the width of a waveguide may be taken as the width of the waveguide at the widest part of the waveguide.

The taper transition tips 15, 25 enhance coupling from the first and second III-V semiconductor waveguides 10, 20 to the respective third and fourth waveguides 40, 50 below. In effect light travelling through the transition tip is squeezed out of the III-V waveguide and optically coupled into the third or fourth waveguide below.

The third waveguide 40 extends below at least the taper transition tip 15 of the first III-V waveguide so that light may be optically coupled from the taper transition tip 15 to the third waveguide 40. In some examples, the third waveguide 40 may extend below other parts of the first III-V waveguide 10 as well, for example below at least a portion of the first gain section 12. Likewise, the fourth waveguide 50 extends below at least the taper transition tip 25 portion of the second III-V waveguide 20 so that light may be optically coupled from the taper transition tip 25 to the fourth waveguide 50. In some examples, the fourth waveguide 50 may extend below other parts of the second III-V waveguide 20 as well, for example at least a portion of the second gain section 22.

Each of the third waveguide and the fourth waveguide may include a plurality of alternating layers 120, 121 of two different III-V semiconductor materials. A first one of the alternating layers 121 may comprise a third III-V semiconductor material (or in the case of the fourth waveguide a fourth III-V semiconductor material) which has a higher refractive index than a refractive index of the first and second III-V waveguides 40, 50. In this context the refractive index of the first (or second) III-V semiconductor waveguide is an effective refractive index for light propagating through the waveguide, presented by the combination of the active layer 150 and the upper cladding layer 160. The second one of the alternating layers 120 may comprise a fifth III-V semiconductor material (or in the case of the fourth waveguide a sixth III-V semiconductor material) which has a relatively lower refractive index than the refractive index of the material of the first alternating layer 121. In one example the material of the second alternating layer 120 is the same as the material of the upper cladding layer 160 and so has the same refractive index.

There may be any number of alternating layers. In one example there are at least four alternating layers—two of the third (or fourth) III-V semiconductor material and two of the fifth (or sixth) III-V semiconductor material. In the illustrated example there are eleven alternating layers. The third waveguide and the fourth waveguide may be formed of the same materials, in which case the third III-V semiconductor material is the same as the fourth III-V semiconductor material and the fifth III-V semiconductor material is the same as the sixth III-V semiconductor material.

The sum of the first and second alternating layers 121, 120 of the third waveguide 40 have an effective refractive index that is lower than the refractive index of the first gain section 12 of the first waveguide 10 above. This helps to prevent light leaking from the gain section 12 into the third waveguide 40 below. However, at the transition tip 15 of the first waveguide 10, as the tip narrows the optical mode of the light is squeezed out of the transition tip 15 and coupled into the third waveguide 40 below. In the transition tip section 15 of the first waveguide 10, as the optical mode can no longer be entirely contained within the tip 15, the effective refractive index of the tip reduces until it is similar to or lower than the effective refractive index of the third waveguide 40 below. The light is thus squeezed out of the transition tip 15 and flows to region 40 below which has a similar or higher effective refractive index. Diluted waveguide structure 40 with alternating layers of different refractive index 121, 120 makes it possible for the third waveguide 40 to have a large cross sectional area and a relatively high refractive index, while avoiding the difficulties associated with manufacturing a single thick layer of high refractive index. For instance, it can be difficult to manufacture a large cross section waveguide of InGaAsP, but by adding thin layers of an InGaAsP between alternating layers of thick InP a much larger waveguide can be formed. In this context the term "thick" means that the thick layer is at least three time thicker than the "thin" layer. Further, as the InGaAsP has a higher refractive index than InP, the overall effective refractive index of the third waveguide 40 is slightly increased thus enhancing the coupling from the taper transition tip 15 of the first waveguide 10.

In one example the third (or fourth) III-V semiconductor material in layer 121 which has a relatively higher refractive index is a quaternary semiconductor material. In one example, the quaternary semiconductor material comprises InGaAsP. In another example, the quaternary semiconductor material comprises AlInGaAs. In one example the third (or fourth) III-V semiconductor material in layer 121 is n-type doped, for example it may be n-InGaAsP. In one example, the fifth (or sixth) III-V semiconductor material in layer 120 which has a relatively lower refractive index may be the same as a material of the upper cladding layer 160 of the first (or second) III-V waveguide. In one example, the fifth (or sixth) III-V semiconductor material is InP. The uppermost of the alternating layers 130 may be formed of the fifth (or sixth) III-V semiconductor material of relatively lower refractive index. In the illustrated example the upper most alternating layer 130 of the third (or fourth) waveguide acts as a lower cladding layer for the first (or second) III-V waveguide above.

The higher refractive index of the third (or fourth) III-V semiconductor material of the first alternating layer 121 and the alternating layer structure of the third and fourth waveguides helps to draw light into the third or fourth waveguide and to enlarge the mode of the light to fill the third or fourth waveguide.

Figure 4:
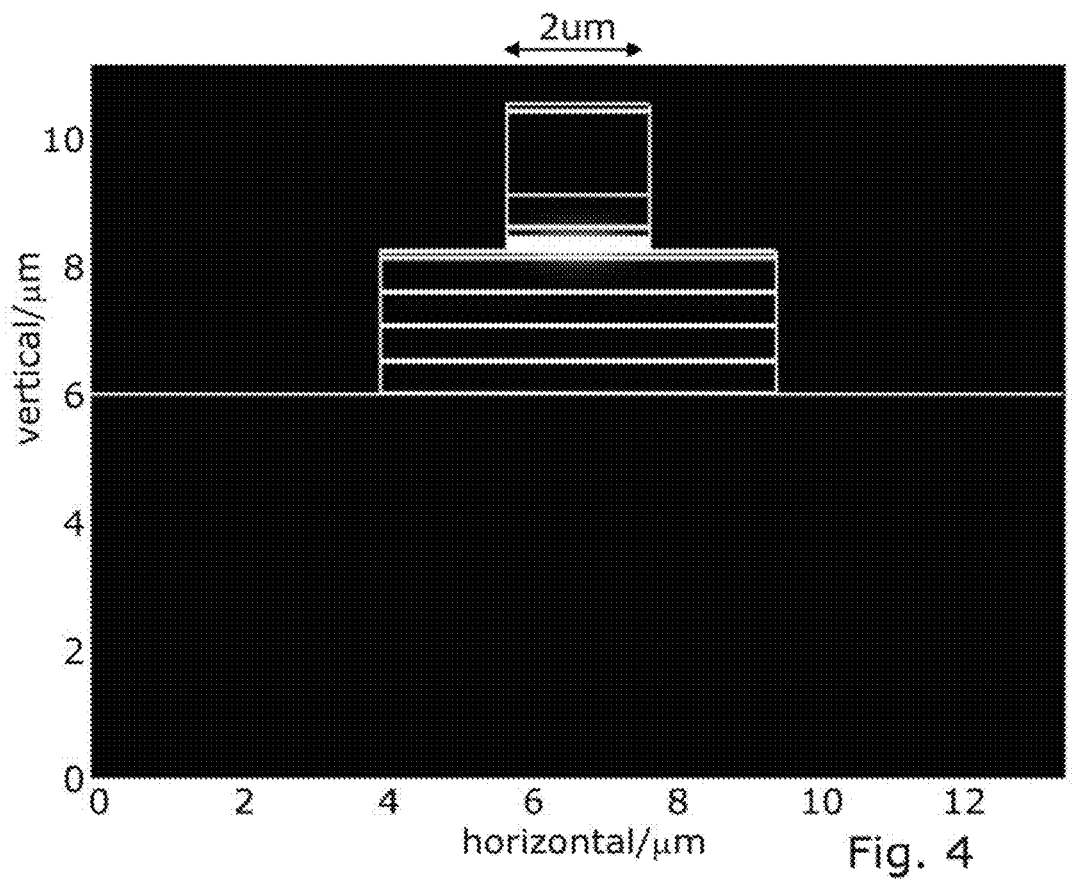
FIG. 4 shows an example light distribution in a first III-V semiconductor waveguide.
Figure 5:
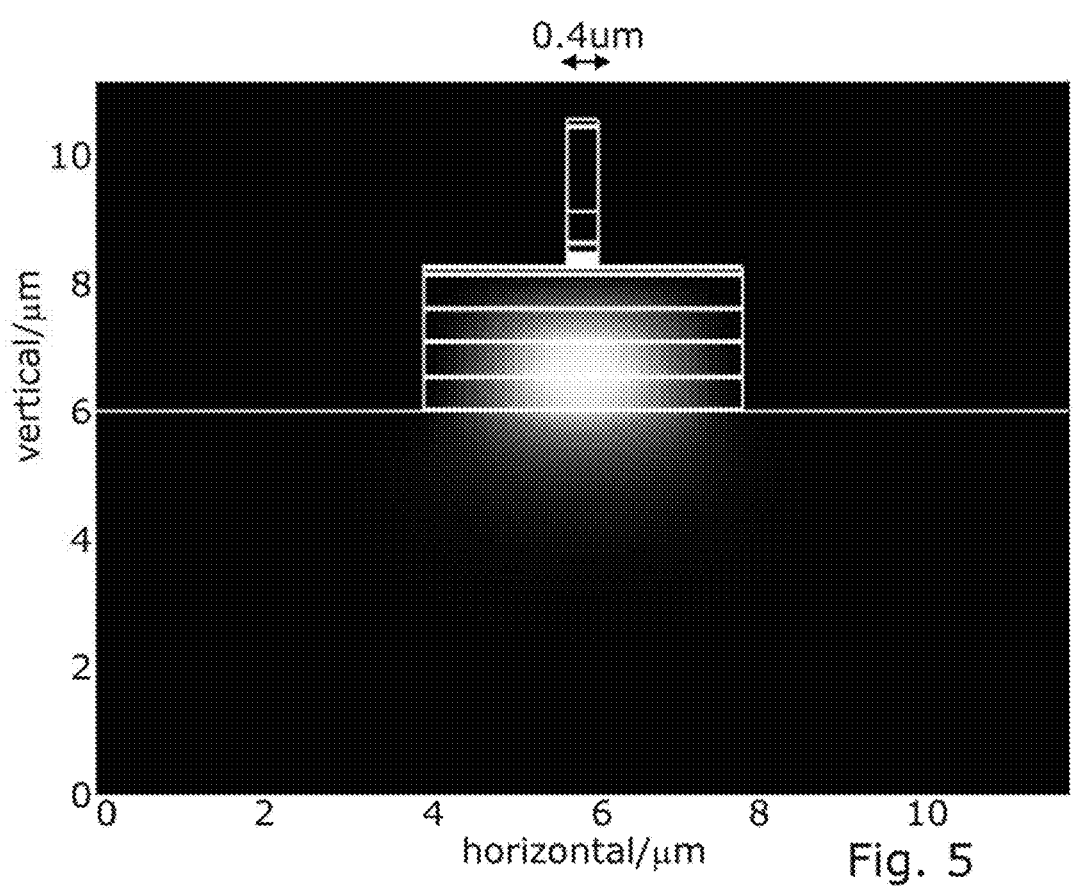
FIG. 5 shows an example light distribution in a third III-V semiconductor waveguide below a taper transition tip of the first III-V waveguide.
Figure 6:
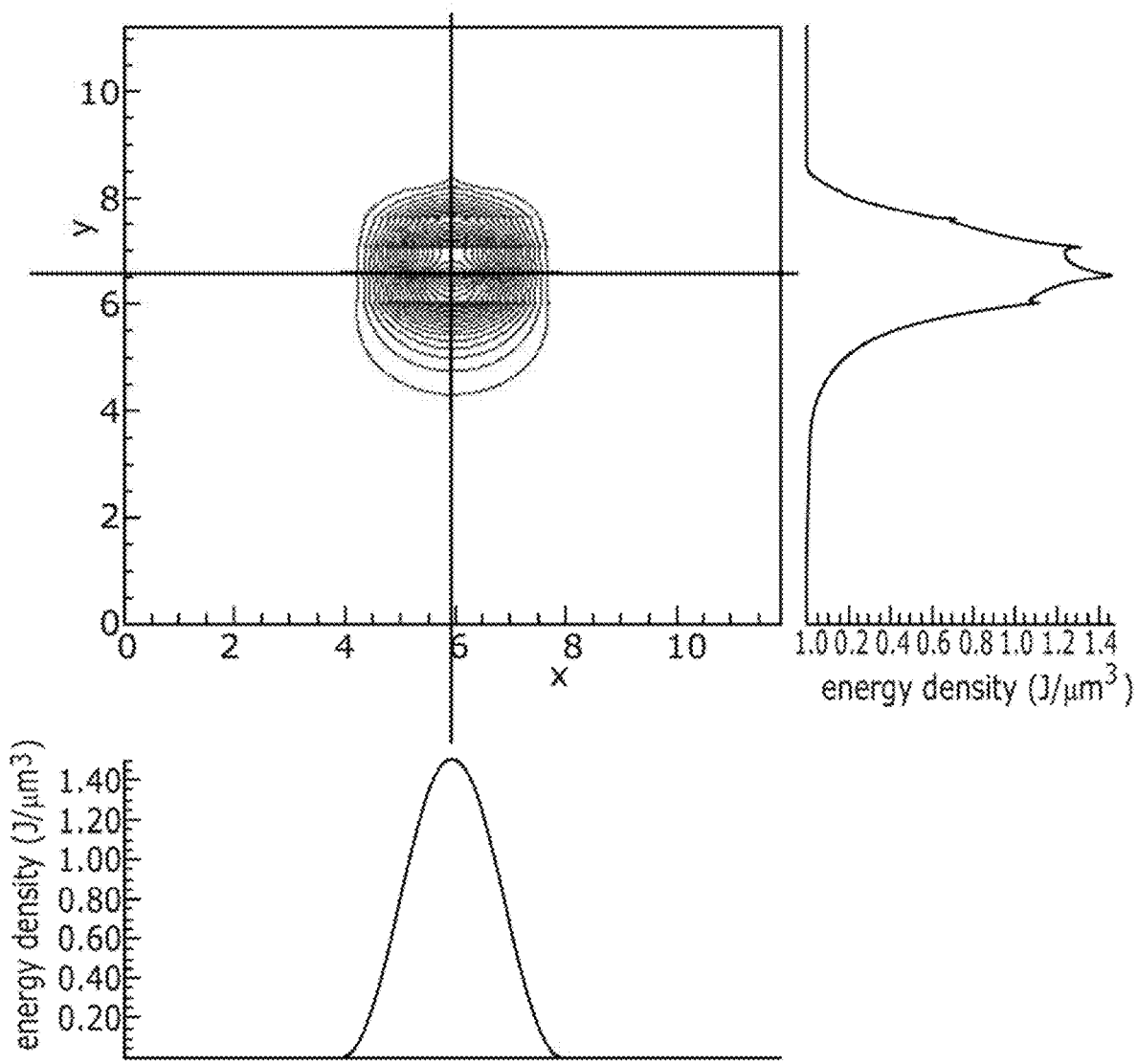
FIG. 6 is a graph showing the example light distribution in the third III-V semiconductor waveguide.

FIG. 4 is a diagram showing a simulation of light in an example first III-V waveguide above the third III-V waveguide at a point where the first III-V waveguide has a width of 2 µm. FIG. 5 is a diagram showing an example simulation of how light is pushed from a taper transition tip of the example first waveguide which has a width of about 0.4 µm into the third waveguide below. In this example, the third waveguide has a width of about 4 µm. As can be seen, the optical mode which the light adopts in the third waveguide has a much larger size than the optical mode which the light adopts in the first waveguide. FIG. 6 is a diagram showing a simulation of the light distribution in the example third waveguide of FIG. 5 in more detail.

Figure 7:
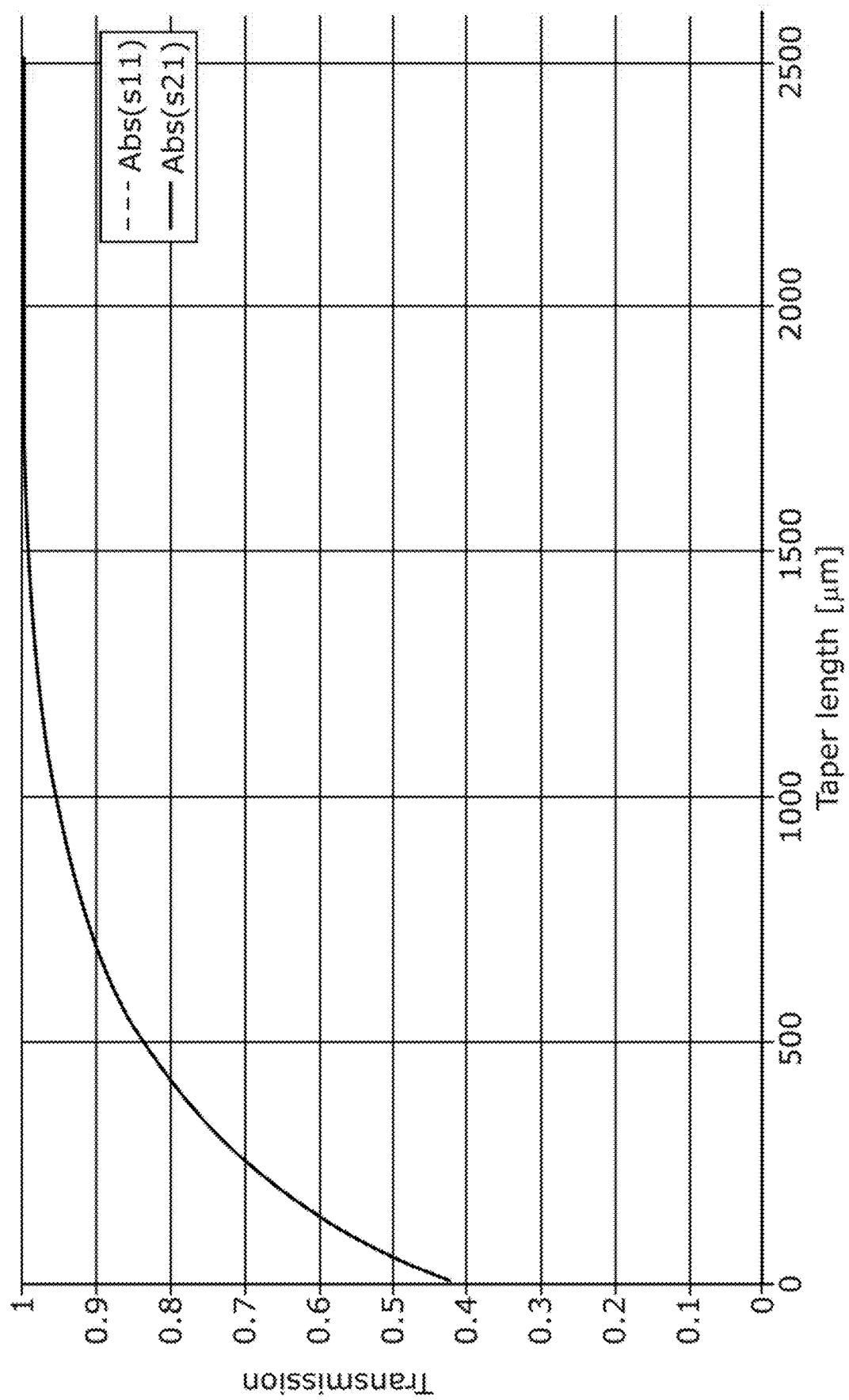
FIG. 7 is a graph showing transmission against taper transition tip length for an example taper transition tip of a III-V semiconductor waveguide.

FIG. 7 is a graph showing an example of transmission versus taper transition tip length in µm. Taper transition tip length may be measured as the distance along the direction of propagation of light in the first (or second) III-V waveguide from the main section of the first (or second) III-V waveguide where the tapering starts to the narrowest point of the tip. Transmission is expressed as a fraction of the light optically coupled from the first or second III-V waveguide to third or fourth waveguide or vice versa. The line Abs(s21) shows transmission from the III-V first waveguide to third waveguide below for taper transition tip width of 400 nm. Meanwhile the line Abs(s11) shows back reflection from the first III-V waveguide back into the first III-V waveguide at the taper transition tip. In this example, it turns out that for a tip width of 400 nm the back reflection is not significant. Thus the line Abs(s11) cannot be seen on the graph. In one example, the taper transition tips have a length greater than 1000 µm and/or a tip width of 400 nm or less. In one example, each taper transition tip has a length of at least 1500 µm. This may help to ensure good transmission from the first (or second) III-V waveguide to the third (or fourth) waveguide.

As mentioned above, the third waveguide 40 includes a first reflector 41 and the fourth waveguide 50 includes a second reflector 51. The reflectors may be positioned at respective ends of the third and fourth waveguides. For example, the first and second reflectors 41, 51 could be mirrors such as deeply etched slots, or cleaved facets or etched facets at the ends of the third and fourth waveguides. Thin films, such as SiO2, Si3N4, Au, etc may be applied on the reflectors to enhance their reflectivity. Each reflector has a reflectance. In the context of this disclosure, the reflectance of a reflector is the proportion of incident light which the reflector reflects back into the waveguide.

One of the first reflector 41 and the second reflector 51 may have a lower reflectance than the other. The reflector with the lower reflectance may be associated with an output of the tunable hybrid laser. In the example of FIG. 2, the first reflector 41 has a lower reflectance than the second reflector 51. A portion of the resonant laser light within the first cavity may escape through the first reflector 41. The first reflector 41 may thus act as the output of the tunable laser. In one example, the first reflector 41 may have a reflectance of between 30% and 80%, while the second reflector 51 may have a reflectance of close to 100%, e.g. 99% or greater.

Figure 8A:
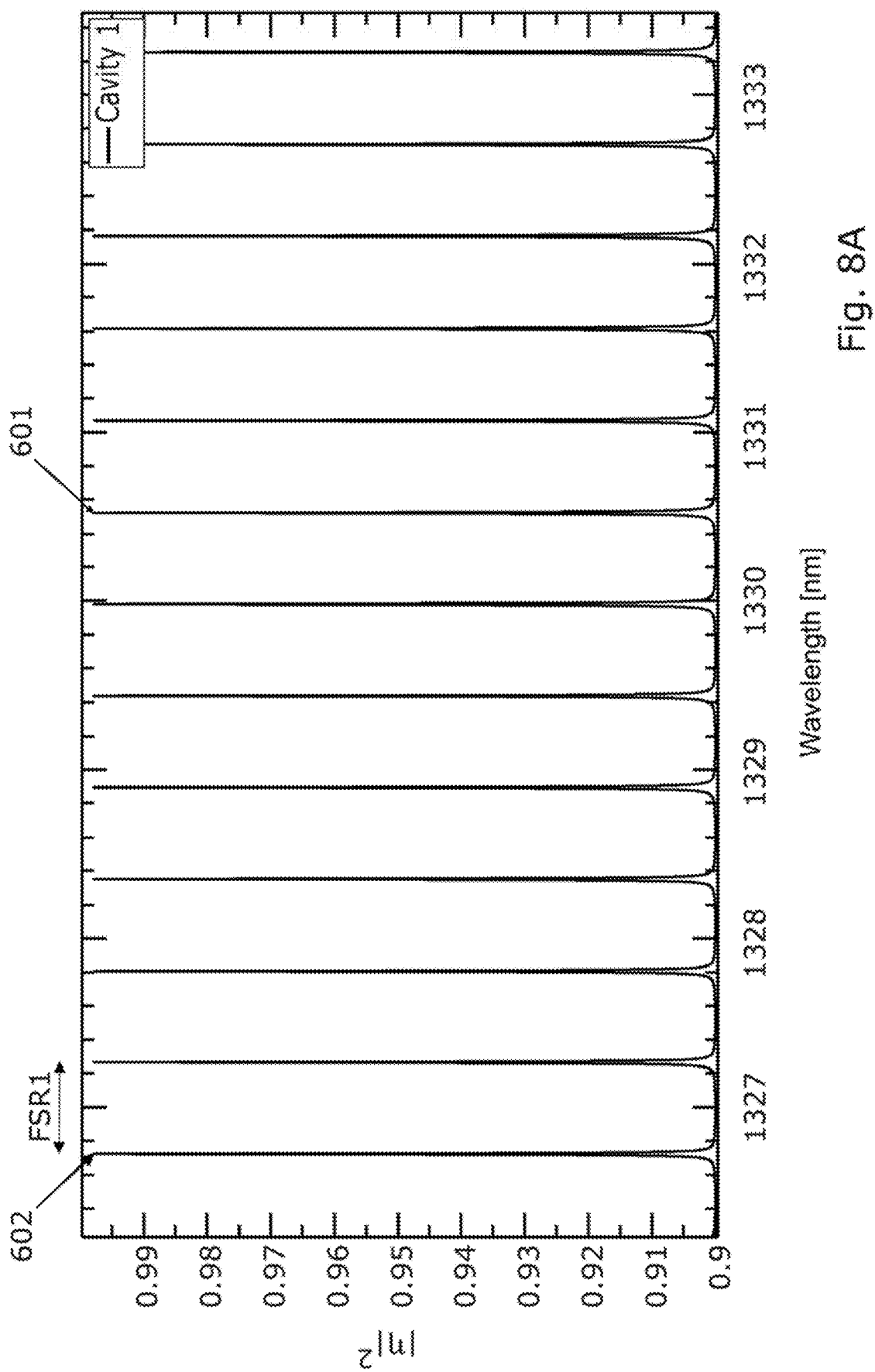
FIG. 8A is a graph showing example resonant frequencies for a first laser cavity.

Light in the first laser cavity 1 may be reflected between the reflector 41 and the optical coupler 30 as shown in FIG. 1. Therefore light in the first cavity 1 may have a plurality of resonant wavelengths. An example of this is shown in FIG. 8A. The y-axis shows the effective reflection factor vs wavelength on the x-axis. The resonant wavelengths are those for which there is a peak, for instance 601 and 602. The first cavity 1 may have a first free spectral range (FSR), which is the spacing between successive resonant wavelengths, for example as shown by the arrow FSR1 in FIG. 6A.

Figure 8B:
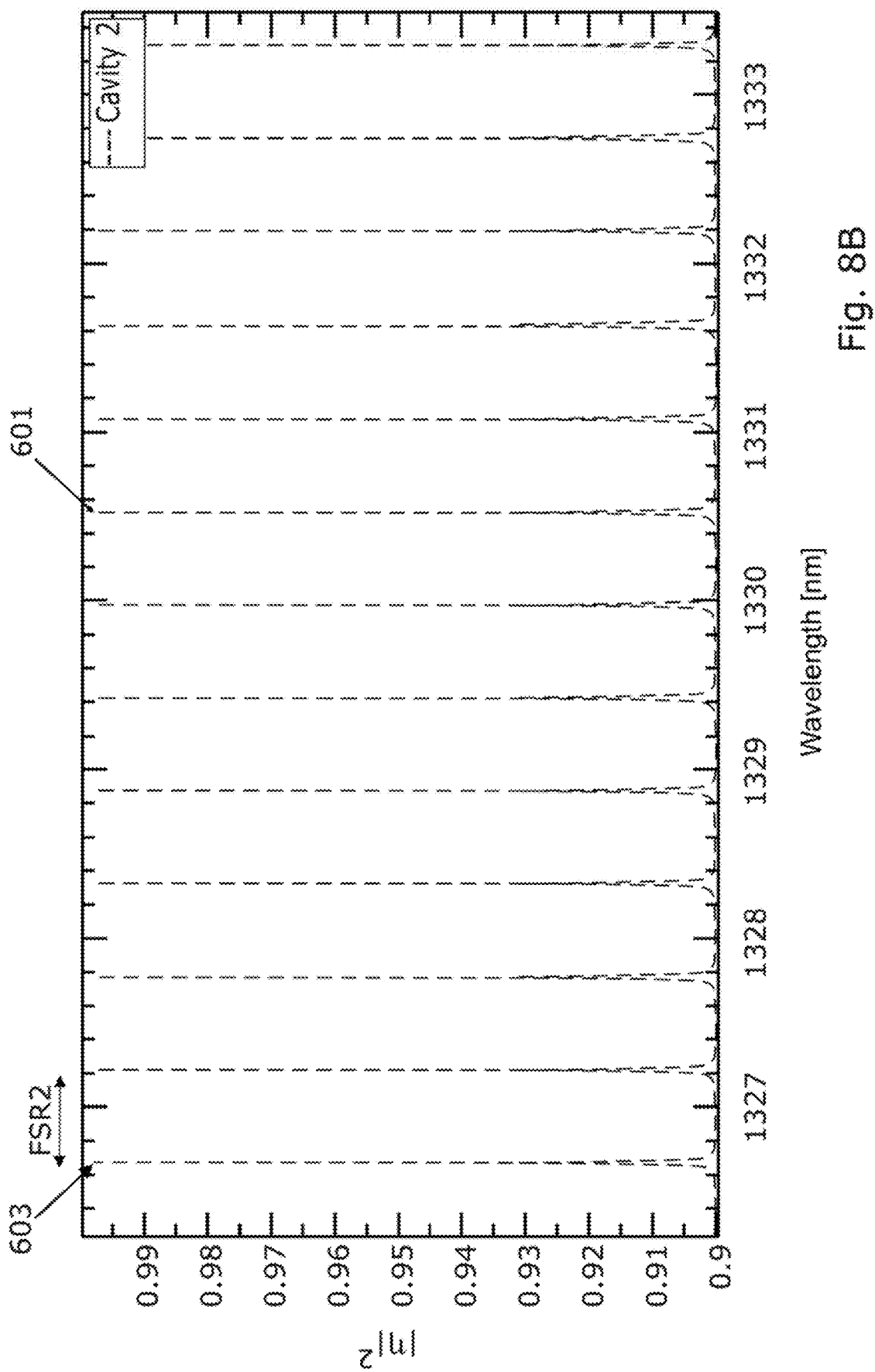
FIG. 8B is a graph showing example resonant frequencies for a second laser cavity.

Light in the second laser cavity 2 may be reflected between the reflector 51 and the optical coupler 30 as shown in FIG. 1. Therefore light in the second cavity 2 may have a plurality of resonant wavelengths, an example of which is shown in FIG. 8B. The resonant wavelengths are those for which there is a peak, for instance 601 and 603. The second cavity 2 may have a second free spectral range (FSR), which is the spacing between successive resonant wavelengths for example as shown by the arrow FSR2 in FIG. 8B.

Figure 8C:
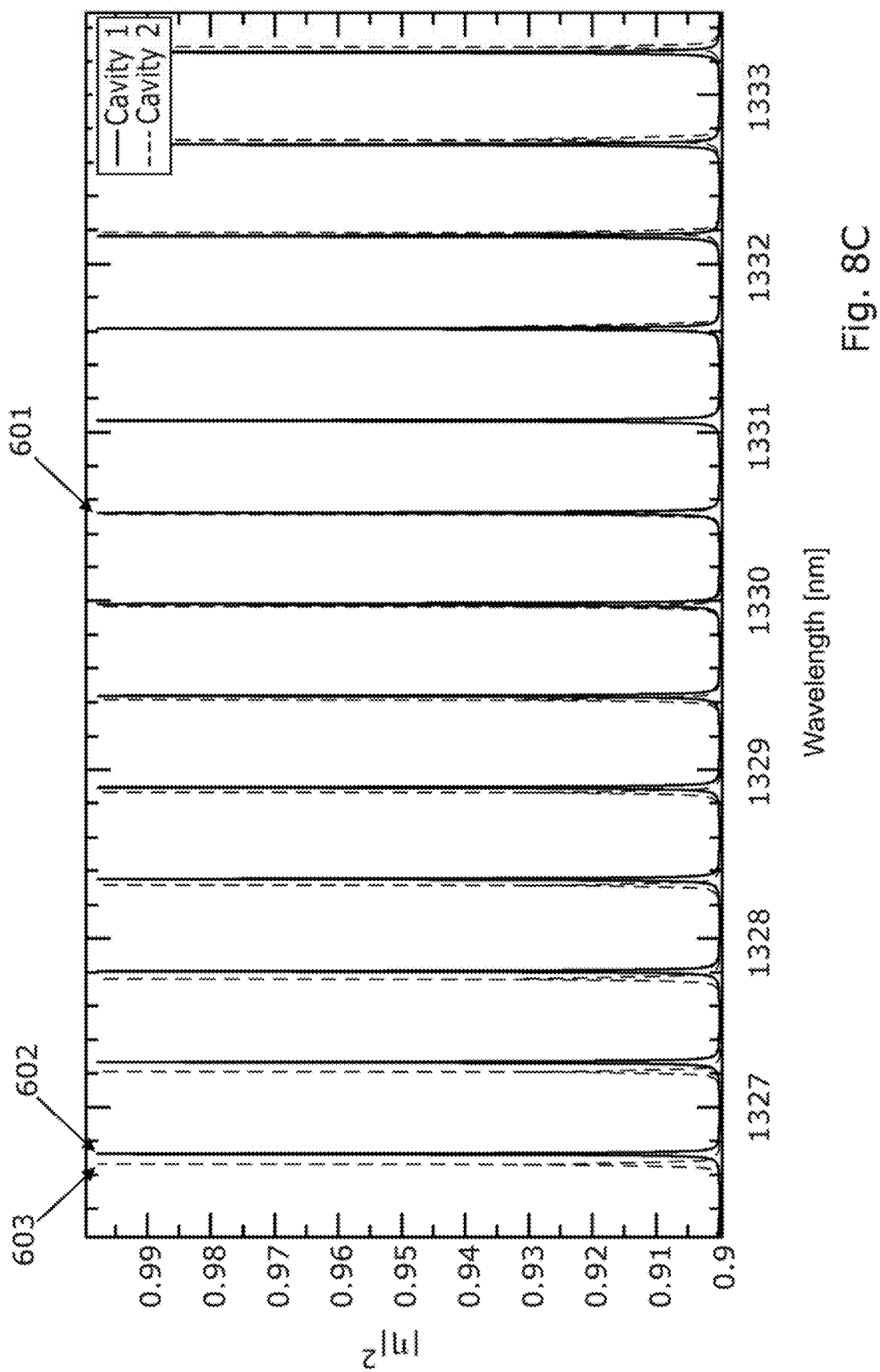
FIG. 8C is a graph showing the example resonant frequencies of the first and second laser cavities superimposed.

The first FSR (FSR1) and the second FSR (FSR2) are different from each other. Therefore many of the wavelengths which are resonant in the first cavity are not resonant in the second cavity and vice versa. Put another way, only some of the wavelengths are resonant in both the first cavity and the second cavity. FIG. 8C shows a superposition of FIGS. 8A and 8B, i.e. a superposition of the wavelengths resonant in the first cavity and the wavelengths resonant in the second cavity. In this example, FIGS. 8A to 8C show resonant wavelengths in the range 1326 nm to 1334 nm. It can be seen from FIG. 8C that in this range only one of the resonant wavelengths 601 overlaps. In this context an overlapping resonant wavelength means a wavelength which is resonant in both the first laser cavity and the second laser cavity.

In this example, the overlapping resonant wavelength 601 is approximately 1330.5 nm. Meanwhile other resonant wavelengths of the first and second cavities do not overlap in the range shown in FIG. 8C. For example, the wavelength 602 which is resonant in the first cavity is not resonant in the second cavity. Likewise the resonant wavelength 603 which is resonant in the second cavity is not resonant in the first cavity.

As the first laser cavity and second laser cavity are optically coupled, light may be coupled from the first laser cavity to the second laser cavity by the optical coupler 30 and light may be coupled from the second laser cavity to the first laser cavity by the optical coupler 30. Therefore resonant wavelengths of the first laser cavity may enter the second laser cavity and resonant wavelengths of the second laser cavity may enter first laser cavity. These resonant wavelengths may interfere with each other. The result is that overlapping resonant wavelengths, i.e. wavelengths which are resonant in both the first cavity and the second cavity may interfere constructively, while other resonant wavelengths may interfere destructively.

Figure 8D:
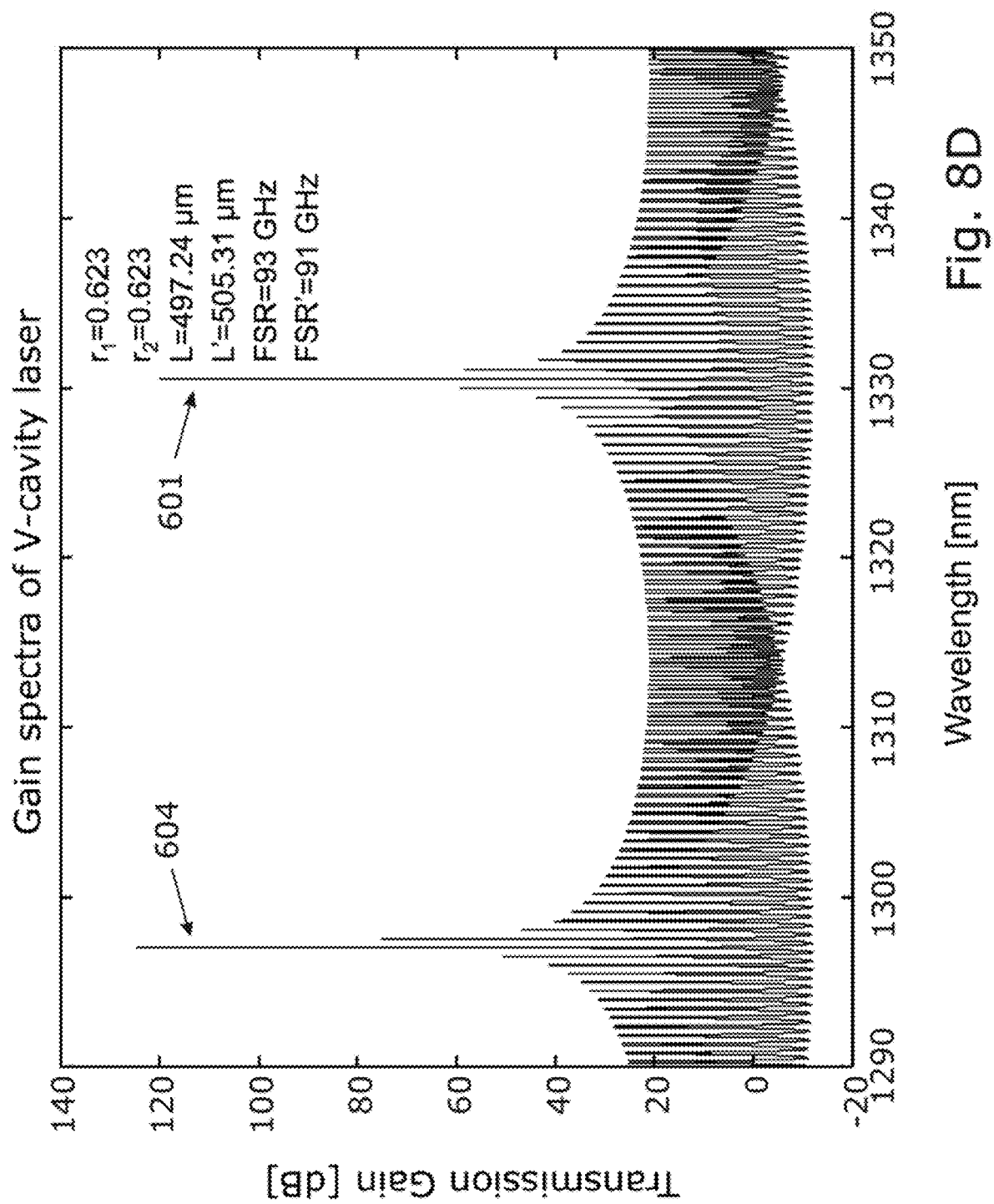
FIG. 8D is a graph showing example gain against wavelength for an example tunable laser according to the present disclosure.

Effective lasing may occur just for the overlapping resonant wavelengths, i.e. for the wavelength or wavelengths which are resonant in both the first laser cavity and the second laser cavity. This may be because a lasing threshold of the gain sections is met only by the overlapping resonant wavelengths (a lasing threshold is an optical power threshold above which lasing can occur). FIG. 8D shows an example of wavelength against gain in the first and second cavities over a larger range from 1290 nm to 1350 nm once this destructive and constructive interference is taken into account. As can be seen there is significant gain for the overlapping resonant wavelength(s), in this example 1297.6 nm and 1330.5 nm. The example of FIG. 8D is based on a model with a FSR for the first cavity (FSR1) of 93 GHz and a FSR for the second cavity (FSR2) of 91 GHz.

Furthermore, effective lasing may occur only for wavelengths which are within a gain bandwidth of the first gain section and the second gain section. The gain bandwidth is the range of wavelengths over which the gain section is capable of lasing and amplifying light. The gain bandwidth may depend upon the materials and structure of the gain section.

In order to output just one wavelength of laser light at a time, the tunable laser may be designed such that there is only one overlapping resonant wavelength within the lasing bandwidth of the first gain section and the second gain section. For example, a length of the first laser cavity and a length of the second laser cavity may be such that within the lasing bandwidth of the first and second gain sections there is only one resonant wavelength overlap between the first and second laser cavities. The example of FIG. 8D shows two resonant wavelength overlaps with strong gain, one at 1297 nm indicated by reference numeral 604 and another at 1330.5 nm indicated by reference numeral 601. However, if in another example the gain bandwidth of the first gain section and second gain section was between 1310 nm and 1345 nm, then only the overlapping resonant wavelength peaks 601 would be within this gain bandwidth and experience strong gain. The other resonant wavelength overlap 604 at 1297.6 nm would in that case experience little gain as it would be outside the gain bandwidth.

The laser may be tuned by adjusting the resonant wavelengths of the first laser cavity and/or by adjusting the resonant wavelengths of the second laser cavity. Adjusting the resonant wavelengths of a cavity means shifting the frequency comb of resonant wavelengths. For example, if resonant wavelengths of the first laser cavity include 1310 nm, 1311 nm and 1312 nm, then by tuning the first laser cavity the resonant wavelengths may be adjusted to 1310.5 nm, 1311.5 nm and 1312.5 nm or in the other direction to 1309.5 nm, 1310.5 nm and 1311.5 nm. By tuning the first laser cavity to adjust the resonant wavelengths of the first laser cavity, due to the slightly different FSRs of the first laser cavity and the second laser cavity, the overlapping resonant wavelengths may be shifted by an even smaller amount. This is known as the Vernier effect. The Vernier effect thus allows relatively larger shifts in the resonant wavelength of one of the laser cavities to lead to relatively smaller shifts in the overlapping resonant wavelength(s). This facilitates tuning to a high degree of precision. If both the first laser cavity and the second laser cavity are independently tunable, then the tuning precision is further enhanced. In general if one of the laser cavities is tunable then the output wavelength of the tunable laser may be stepped between discrete wavelengths. However, if both the first and second laser cavities are independently tunable then the output wavelength of the tunable laser may be varied continuously over a range.

A laser cavity may for example be tuned by injecting current into the gain section or otherwise heating the gain section. Both these actions change the effective refractive index of the gain section. A change in the effective refractive index changes the overall length of the laser cavity in terms of number of wavelengths and thus changes the wavelengths at which light is resonant.

Figure 9:
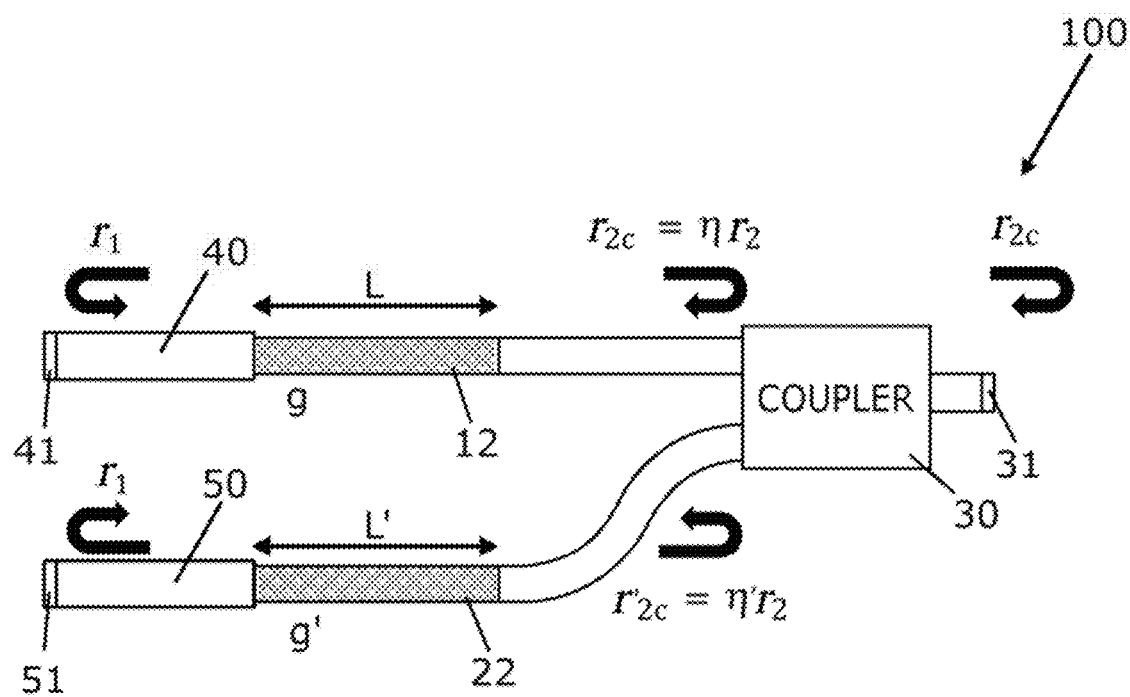
FIG. 9 shows a schematic view of an example tunable laser according to the present disclosure.

FIG. 9 is a schematic diagram showing an example of the tunable laser similar to FIG. 1. Note that the first III-V semiconductor waveguide 10 may have a different length to a length of the second III-V semiconductor waveguide 20. This causes the FSR of the first laser cavity to be different to the FSR of the second laser cavity.

FIG. 9 shows how at the optical coupler 30 there may be light from the first laser cavity which is incident on the optical coupler 30 and reflected back into the first laser cavity ($r_{2e}$), light from the second laser cavity which is incident on the optical coupler 30 and reflected back into the second laser cavity ($r'_{2e}$), and light coupled by the optical coupler 30 from the first laser cavity into the second laser cavity or from the second laser cavity into the first laser cavity ($r_{2C}$).

Light which is reflected undergoes a 180 degree phase shift. Further, the optical coupler 30 may be designed such that light optically coupled between the first and second laser cavities undergoes a 180 degree phase shift. That is the optical coupler 30 is to couple light between the first III-V semiconductor waveguide and the second III-V semiconductor waveguide such that there is a 180 phase difference between light entering the optical coupler 30 and leaving the optical coupler. This may help to reduce the side mode suppression ratio of the output laser light. The optical coupler 30 may include a reflector 31, such as a an etched slot or facet to reflect light coupled from the first cavity to the second cavity or vice versa back in the opposite direction towards the reflector 41 or 51 at the other end of the cavity. The reflector 31 may provide the 180 degree phase shift in the optically coupled light. Forming the reflector 31 by etching rather than cleaving may help to define the length of the optical coupler to a high degree of accuracy. This may help in creating the 180 degree phase shift.

FIG. 9 shows various parameters, including a length L of the first gain section, a gain g of the first gain section, a length L' of the second gain section and a gain g' of the second gain section. Further parameters affecting the behavior of the laser may include the following. $C_{11}$: the self-coupling coefficient of the first laser cavity, $C_{21}$: cross-coupling coefficient from the second laser cavity to the first laser cavity, $C_{12}$: cross-coupling coefficient from the first laser cavity to the second laser cavity, $C_{22}$: self-coupling coefficient of the second laser cavity, $r_1$: field reflection of the first and second reflectors at the open end of the first and second laser cavities, $r_2$: field reflection of closed optical coupler end of the laser cavities, k: wavenumber of the first laser cavity, k' wavenumber of the second laser cavity.

Based on the above the effective field reflections of the first and second laser cavities may be calculated as follows:

Effective field reflection calculation:

$r_{2e} = \eta r_2$ $\eta = C_{11} + C_{21}C_{12}r_1r_2$ $e^{2(g'+jk')L'}\left(1 + C_{22}r_1r_2 e^{2(g'+jk')L'} + C_{22}^2 r_1^2 r_2^2 e^{4(g'+jk')L'} + \ldots\right) =$ $$C_{11} + \frac{C_{21}C_{22}r_1r_2 e^{3(g'+jk')L'}}{1 - C_{22}r_1r_2 e^{2(g'+jk')L'}}$$

$r'_{2e} = \eta' r_2$ $\eta' = C_{22} + C_{21}C_{12}r_1r_2$ $e^{2(g+jk)L}(1 + C_{11}r_1r_2 e^{2(g+jk)L} + C_{11}^2 r_1^2 r_2^2 e^{4(g+jk)L} + \ldots) =$ $$C_{22} + \frac{C_{11}C_{12}r_1r_2 e^{2(g+jk)L}}{1 - C_{22}r_1r_2 e^{2(g+jk)L}}$$

One of the third and fourth waveguides is associated with the output of the tunable laser. In the example of FIG. 2, the third waveguide 40 is associated with the output of the tunable laser. As can be seen in FIG. 2, the third waveguide 40 associated with the output is substantially perpendicular to an edge of a photonic integrated chip in which the tunable laser is formed. In this way it is easier to optically couple the output of the tunable laser to an external optical component, such as an external waveguide, external fiber or to another photonics integrated chip, as output light is at right angles to edge. Further, as the third waveguide has a relatively large width and/or cross sectional area it is easy to align the third waveguide with an external component.

The third waveguide 40 and the fourth waveguide 50 may be parallel to each other. This may make tuning and optical balancing of the first and second laser cavities more reliable and easier to calculate. Thus, in some examples, both the third waveguide and the fourth waveguide may be perpendicular to an edge of the photonic integrated chip.

At least one of the first III-V waveguide 10 and the second III-V waveguide 20 may include a bend of at least 60 degrees. The part of the waveguide including the bend is referred to as the bend section. For instance the III-V waveguide may include a straight section which is perpendicular with an edge of the chip and a bend section which deviates from this direction. In the illustrated examples the second waveguide includes a bend section 24 (see e.g. FIG. 2). The bend section 24 may include two bends, one inward (e.g. towards the first III-V waveguide) and one back towards the perpendicular direction. The bends may be of more than 60 degrees. In one example each of the bends may be of approximately 90 degrees.

The bend section makes it possible for the first and second III-V waveguides to be close to each other where they join the optical coupler 30 to promote optical coupling between them, but spaced far enough apart from each at the gain sections so as not to interfere with each other. It also enables the sections of the III-V waveguides remote from the optical coupler 30 to be parallel to each other and/or to run in a direction perpendicular to an edge of the chip. If the first (or second) waveguide and associated third (or fourth) waveguide runs perpendicular to the edge of the chip, this makes butt-coupling to an external waveguide, fiber or other external optical component easier. Further, the bend section enables one of the first and second III-V waveguides to be longer than the other, while maintaining a compact footprint.

Figure 10A:
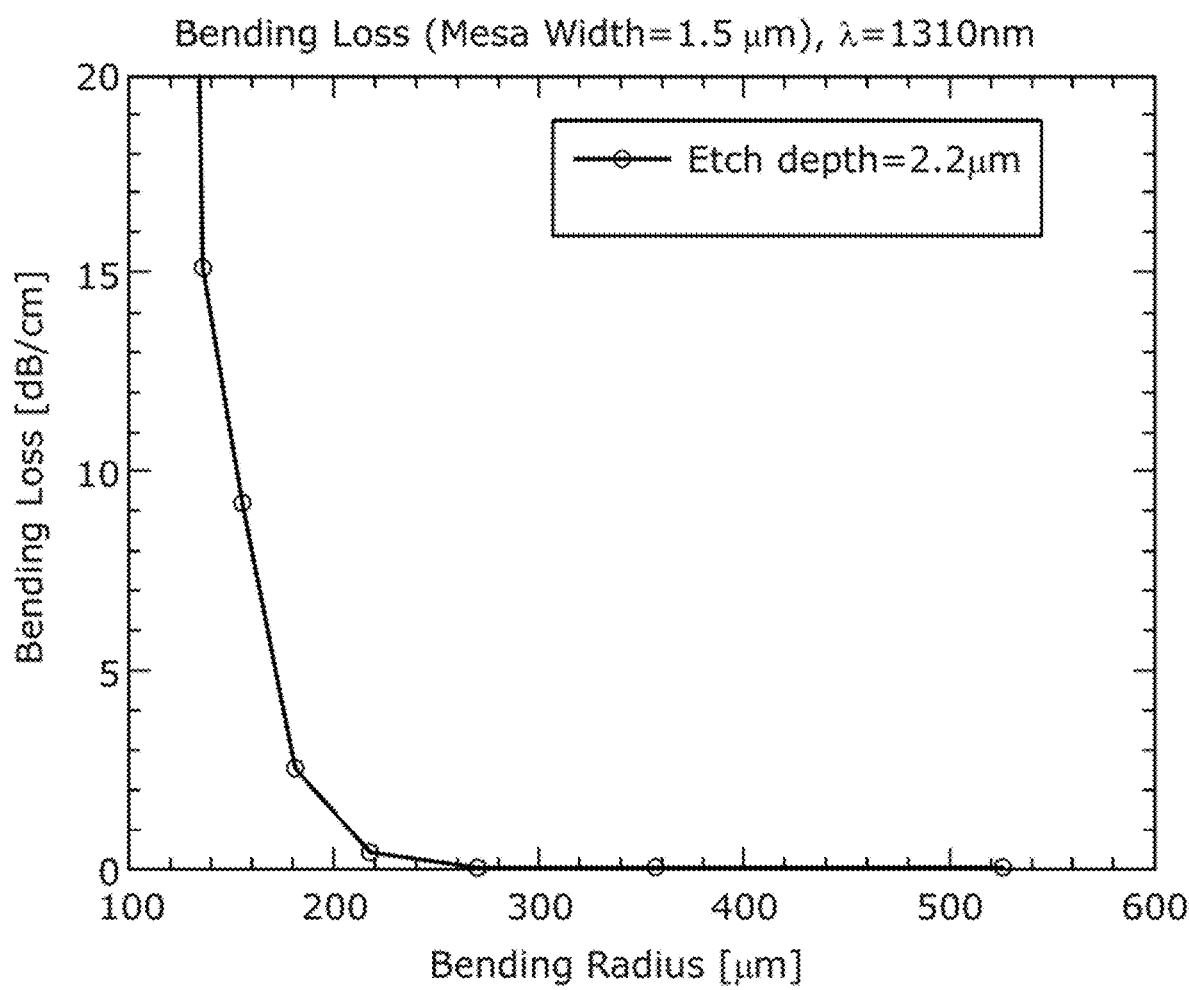
FIGS. 10A and 10B are graphs showing bend loss against bend radius for an example III-V semiconductor waveguide.
Figure 10B:
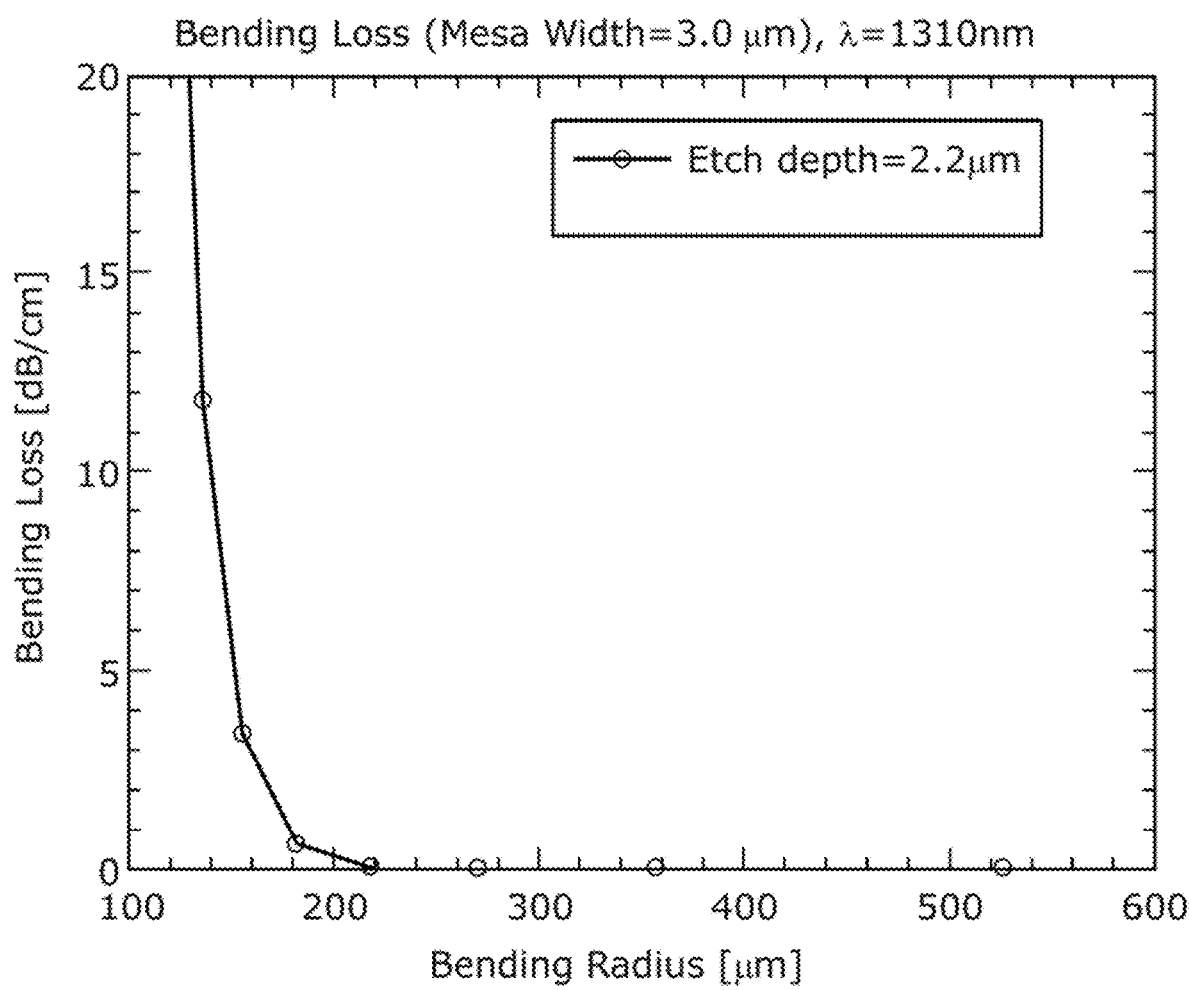

A bend may have a bend radius, which is a measure of the bend defined as the radius of a circle having the same curvature as the inside of the bend. The shorter the bend radius, the tighter the bend. FIG. 10A is a graph showing bending loss for an example III-V waveguide having a width of 1.5 µm, a height of 2.2 µm. The bending loss is calculated in this example for light of 1310 nm and expressed in dB/cm in terms of reduction of strength of the light signal as it traverses the bend. FIG. 10B shows bending loss for the same type of III-V waveguide, but having a width of 3 µm. It can be seen that in both cases the loss is low for bend radius of 200 µm and negligible for bend radius of over 300 µm. While bending loss is undesirable, a tight bend enables the tunable laser to fit in a more compact structure. Thus in one example the bend radius is less than 500 µm. In one example the bend radius is between 200 µm and 500 µm. In one example the bend radius is between 300 µm and 500 µm.

In one example, the bending loss may be reduced by using adiabatic waveguide bends where the radius of curvature gradually changes along the bend to ensure the modes are matched at the interface between the straight and bent sections of the waveguide.

Figure 11:
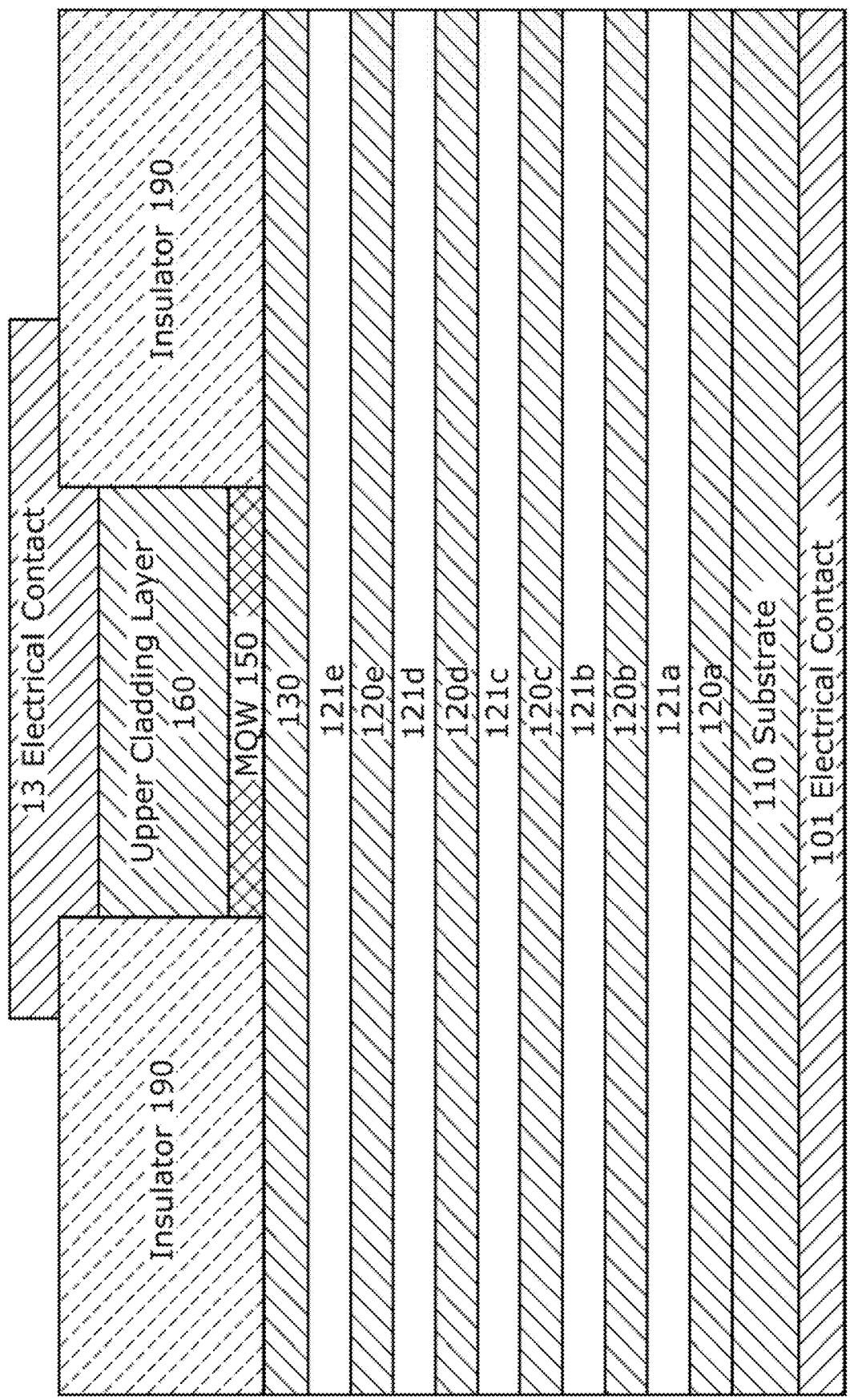
FIG. 11 is a cross sectional view of an example gain section of a III-V semiconductor waveguide.

FIG. 11 shows an example cross section of the first gain section of the first III-V waveguide with respect to the line A-A of FIG. 2. The second gain section of the second III-V waveguide may have the same or a similar structure.

The structure includes an electrical contact layer 101, which may for example be a metal. For example, this layer may comprise Nickel, Germanium or Gold. A III-V material substrate 110 overlies the electrical contact layer 101. For example, the substrate may comprise InP (doped or undoped) or another III-V semiconductor. The third waveguide 40 overlies the substrate 110. The third waveguide comprises alternating layers 120, 121 of two different materials. There may be any number of alternating layers. In the example of FIG. 10 there are ten such layers: layers of a third III-V semiconductor material 121a, 121b, 121c, 121d, 121e and layers of a fifth IIII-V semiconductor material 120a, 120b, 120c, 120d and 120e in between of the layers of the third III-V semiconductor material. The third III-V semiconductor material of the layers 121a to 121e has a refractive index which is greater than a refractive index of the fifth III-V semiconductor material of the layers 120a to 120e. In one example, the third III-V semiconductor material is a quaternary semiconductor. In one example, the third III-V semiconductor material is InGaAsP. In one example, the fifth III-V semiconductor material is InP. The third III-V and fifth III-V semiconductor materials of the alternating layers may be negatively doped.

A further layer 130 of the third III-V semiconductor material may overlie the uppermost alternating layer of the third III-V semiconductor material 121e. In this example, the layer 130 forms a top most alternating layer of the third waveguide. The layer 130 may also act as a lower cladding layer for the gain region of the first. The gain region of the first waveguide includes an active layer 150 and an upper cladding layer 160, as described above in reference to FIGS. 3A and 3B and as shown in FIG. 11. The lower cladding layer 130 may be formed of the same group III-V semiconductor material as the upper cladding layer 160, for example InP.

The third III-V semiconductor material of the first alternating layers (121a to 121e) of the third waveguide has a greater refractive index than an effective refractive index of the waveguide formed by the active layer 150 and the upper and lower cladding layers 130, 160. In this context the effective refractive index of the waveguide is the effective refractive index presented to light propagating through the waveguide by the combination of the active layer 150, the upper cladding layer 160 and the lower cladding layer 130.

As the effective refractive index of the third waveguide is greater than the effective refractive index of the first waveguide, light may be drawn into the third waveguide.

It can be seen that a width of the third waveguide 40, from left to right in FIGS. 3A and 3B, is much larger than a width of the gain section of the first waveguide 10 which lies above the third waveguide.

An electrical contact 13, such as a metal, may be positioned on top of the upper cladding layer 160 of the first waveguide. The metal contact 13 may for example comprise Pt, Ti, Pt or Au. An insulating layer such as a Polyimide layer 190 may protect and electrically isolate the upper surface of tunable laser, in particular the upper surface of the third waveguide and the side edges of the waveguide. In one example the electrical contact 13 may act as a positive terminal, while the electrical contact 101 may act as a negative terminal. In order to stimulate optical gain and emission of light, an electrical current may be passed through the gain region of the tunable laser by applying a voltage or injecting current to the electrical contacts 13, 101. While in the example of FIG. 11, the electrical contact layer 101 is shown as being at the bottom of the stack, underlying the substrate 110, in other examples, the electrical contact 101 may be in a different position. The principle is that the electrical contact 101 should be positioned such that a potential difference applied between the electrical contact 13 and the electrical contact 101 causes an electrical current to flow in the first gain section 12 of the first waveguide, and/or such that a potential difference applied between the electrical contact 23 and the electrical contact 101 causes an electrical current to flow in the second gain section 22 of the second waveguide. For example, the electrical contact 101 may overlie the third and/or fourth waveguides. In one example, as shown in FIG. 3B there is an electrical contact 13A overlying a part of the upper surface of the third waveguide in a position adjacent the gain section of the first waveguide and a similar electrical contact 23A overlying a part of the upper surface of the fourth waveguide in a position adjacent the gain section of the second waveguide. Likewise, there may be an electrical contact 33A overlying a part of the upper surface of the third or fourth waveguide and adjacent the optical coupler and an electrical contact 28A overlying a part of the fourth waveguide and adjacent the electrical contact 28 of the amplitude modulator. Thus in FIG. 3B these electrical contacts 13A, 23A, 33A and 28A are used in place of the electrical contact 101 at the bottom of the stack. This arrangement may be useful in implementations where there is an insulating or semi-insulating substrate or substrate.

Figure 12:
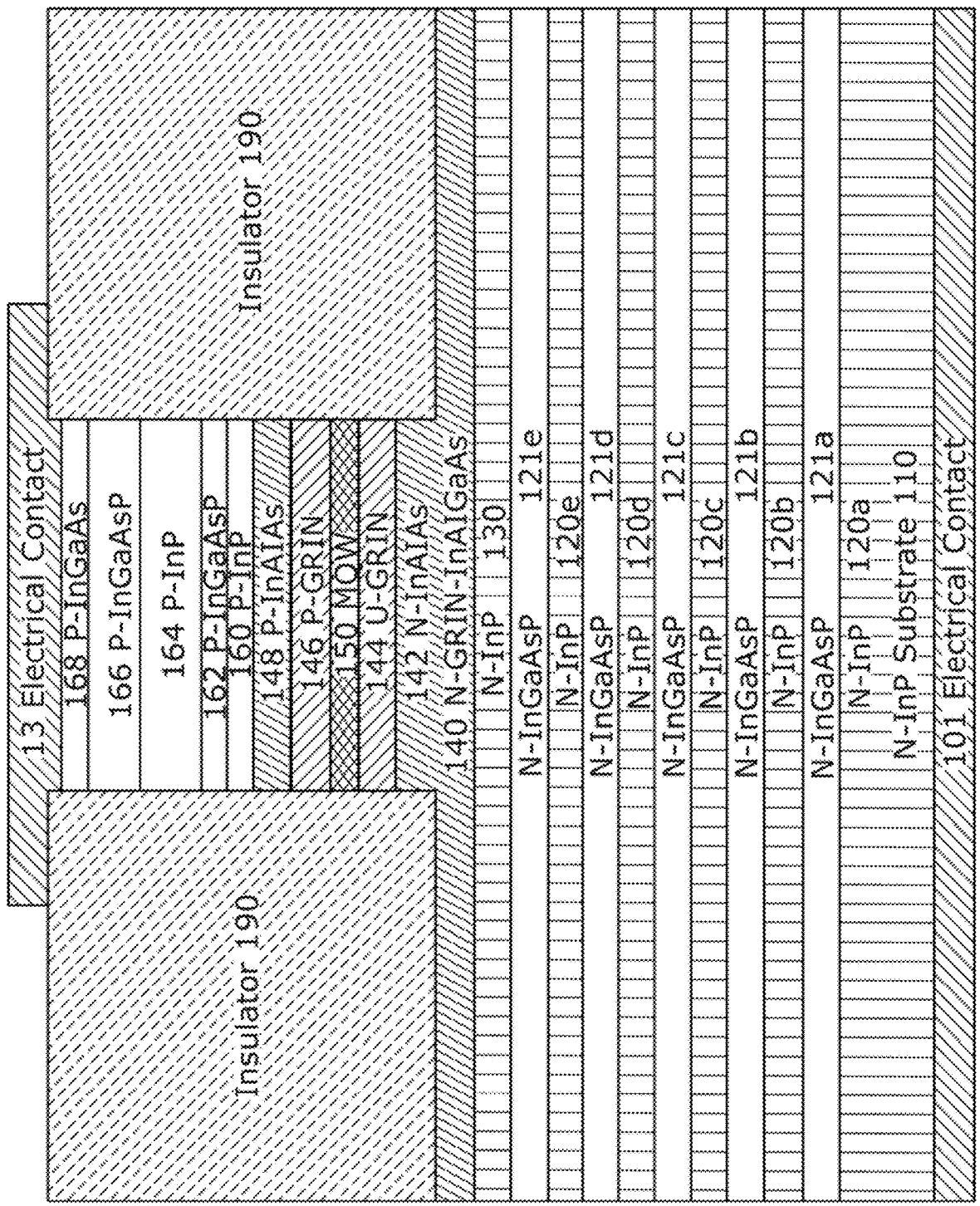
FIG. 12 is a further cross sectional view of an example gain section of a III-V semiconductor waveguide.

FIG. 12 shows another example cross-section of the tunable laser, which is similar to FIG. 11. The electrical contact layers 13, 101 and the alternating layers of the third waveguide are the same as in FIG. 11 and will not be described further here. A thin layer 140 overlies the uppermost alternating layer 130 of the third waveguide and underlies the various layers of the waveguide. In one example the thin layer 140 may comprise N-GRIN-InAlGaAs. A N—InAlAs layer 142 may overlie the thin layer 140. This may be followed by a U-GRIN layer 142, the active layer 150 and a P-GRIN layer 144. A P—InAlAs 148 may overlie the P-GRIN layer. This may be followed by the upper cladding layer 160, which may for example comprise P—InP, a P—InGaAsP layer 162, a P—InP layer 164, a P—InGaAsP layer 166, a P—InGaAs layer 168 and the electrical contact layer 13.

Figure 13:
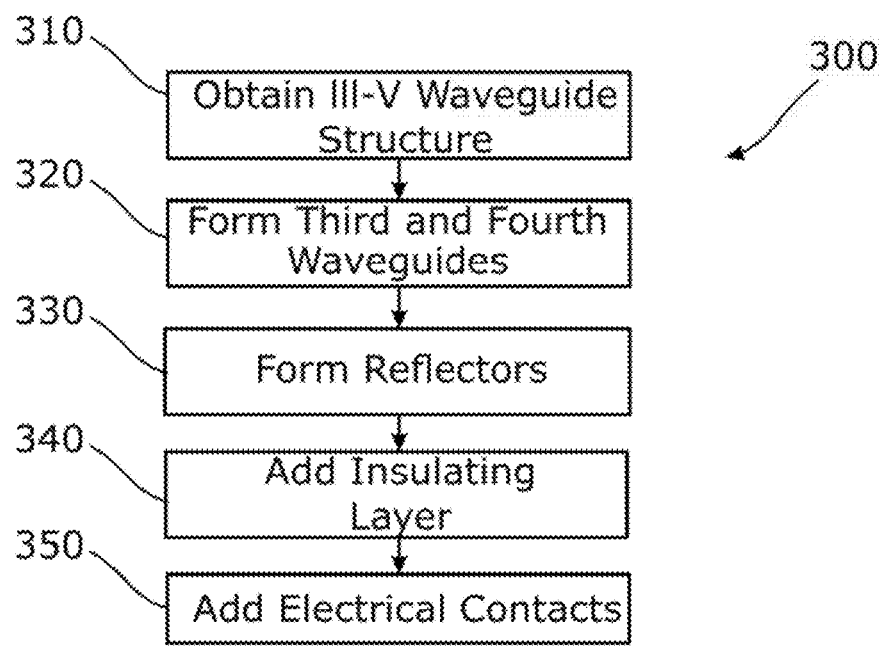
FIG. 13 is a flow diagram showing an example method of manufacturing an example tunable laser according to the present disclosure.

FIG. 13 is a flow diagram showing an example method 300 of manufacturing a tunable laser as described in the examples above.

At block 310 a III-V waveguide structure is obtained. The III-V structure may include a first and second III-V waveguides, including an active layer and an upper cladding layer. The III-V structure may also include an optical coupler. In one example a III-V mesa may be obtained and patterned to form the first and second waveguides, optical coupler, the gain sections of the first and second waveguides, the amplitude modulator if one is used and the taper transition tips of the first and second waveguides.

At block 320, the third and fourth waveguides are formed. Specifically a third waveguide which is to underlie the first waveguide and a fourth waveguide which is to underlie the second waveguide. The third and fourth waveguides may be connected in a U-shape as shown in FIG. 3A.

At block 330, the first reflector is formed on the third waveguide and the second reflector is formed on the fourth waveguide. For example, the reflectors may be formed by etching or cleaving mirrors at ends of the third and fourth waveguides. A reflector may also be formed behind the optical coupler, for example by etching.

At block 340 an insulating layer such as polyimide is deposited over the III-V structure to passivate and planarize the surface.

At block 350 the electrical contacts are formed, e.g. by patterning and depositing a metal layer.

Figure 14:
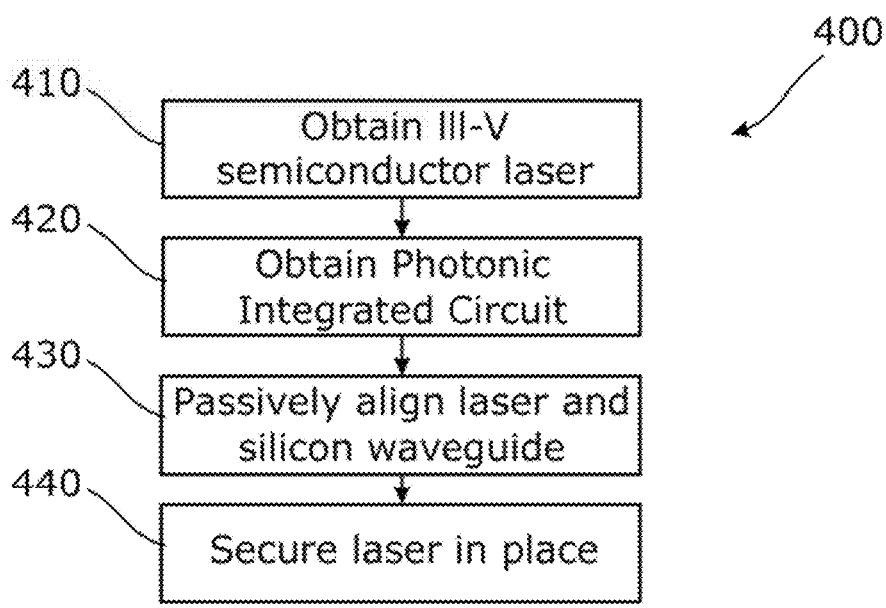
FIG. 14 is a flow diagram showing an example method of manufacturing a hybrid photonics assembly according to the present disclosure.

FIG. 14 is a flow diagram showing an example method 400 of manufacturing a hybrid photonics assembly. For example, the assembly may comprise a III-V semiconductor tunable laser and a silicon photonic integrated circuit (PIC).

At block 410 a III-V semiconductor laser is obtained. The III-V semiconductor comprises a first waveguide which is formed of III-V semiconductor materials and includes a first gain section. The first waveguide at least partially overlies another waveguide, which may e.g. be a diluted waveguide that is to act as part of a mode converter. The another waveguide is formed of III-V semiconductor materials and has a width which is greater than a width of the gain section of the waveguide. The another waveguide may be a diluted waveguide comprising alternating layers of materials of different refractive index. A first end of the first waveguide forms a first end of a laser cavity and a second end of the first waveguide comprising a taper transition tip to couple light from the first waveguide to the another waveguide. An end of the mode converter remote from the first end of the waveguide comprises a reflector. The reflector forms a second end of the laser cavity and an output of the III-V semiconductor laser.

The III-V semiconductor laser may for example be a tunable laser such as that shown in FIGS. 1-3. In some examples the semiconductor laser comprises first and second III-V semiconductor waveguides coupled at one end to an optical coupler and at the other end to respective third and fourth waveguides as described above in FIGS. 1-3.

At block 420 a photonic integrated circuit (PIC) is obtained. The PIC may include an input waveguide that is to receive an optical signal. The input waveguide may comprise a silicon core and a cladding. The cladding is of lower refractive index material compared to silicon, such as but not limited to a polymer or silicon dioxide.

At block 430 the output of the III-V semiconductor laser is aligned with the input waveguide using a passive alignment method. In general, aligning of optical components may be by passive alignment or active alignment. Active alignment includes measuring the optical signal and making adjustments based on this feedback. Active alignment thus requires that the optical components are active and powered when they are aligned. In contrast, passive alignment involves aligning the optical components without optical feedback. For example, passive alignment may be based on mechanical alignment and manufacturing tolerances. As the width and optical mode of the diluted waveguide of the tunable laser is relatively large this makes passive alignment easier. In one example, the diluted waveguide has a width of 3 μm or greater. The diluted waveguide may thus be passively optically aligned with an input waveguide of large width, e.g. 3 μm, relatively easily.

The input waveguide of the PIC may include an end which is to be butt-coupled to the III-V semiconductor laser. This end of the input waveguide may have a relatively large width, as noted above. The input waveguide may be a mode converter which comprises a silicon core in a polymer cladding which has a lower refractive index than the silicon core, wherein the cladding has a width similar to the width of the third waveguide and the silicon core includes a tapered section having a width that reduces in the direction towards the tunable laser.

At block 440 the aligned III-V semiconductor laser is secured in place relative to the input waveguide. For example, the laser may be bonded to a same substrate as the input waveguide.

The method of FIG. 14 may be carried out at a die level by aligning individual laser dies with silicon PICs and securing the individual laser dies in place. However, it is also possible for the method of FIG. 14 to be carried out at the wafer level. A wafer is a slab of semiconductor material comprising a plurality of components which may be separated into separate dies.

Figure 15A:
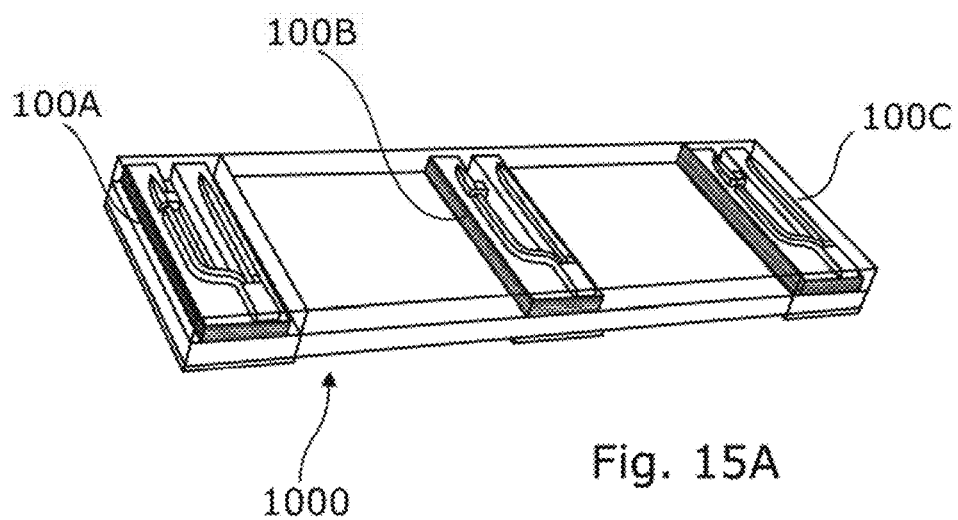
FIG. 15A is a perspective view of an example III-V semiconductor wafer including a plurality of tunable lasers according to the present disclosure.
Figure 15B:
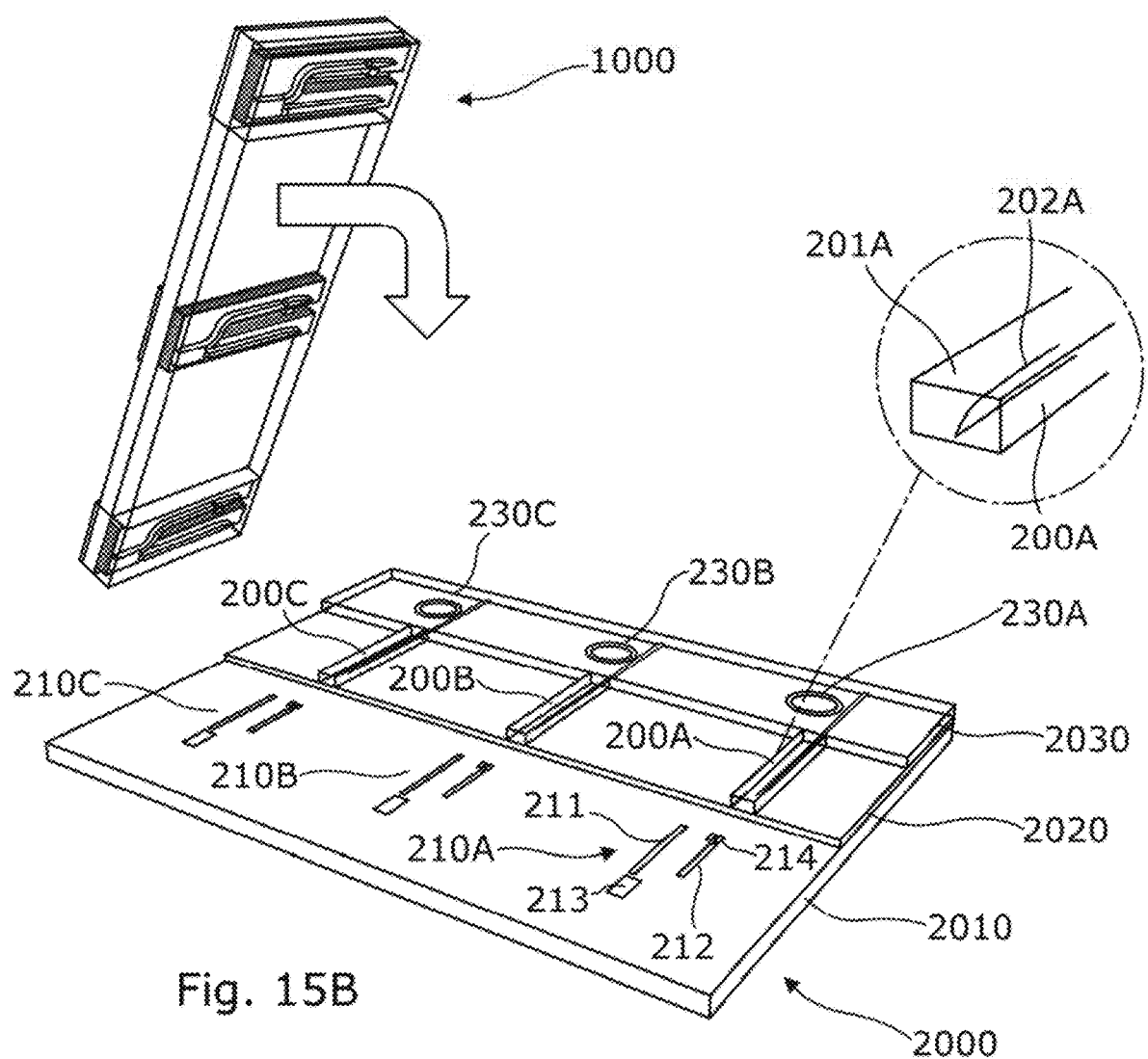
FIG. 15B is a perspective view showing an example of flip chip bonding the III-V semiconductor wafer of FIG. 15A to a silicon photonics wafer.

In one example, the III-V semiconductor laser is one of a plurality of III-V semiconductor lasers formed on a III-V semiconductor wafer. An example is shown in FIG. 15A, which shows a III-V semiconductor wafer 1000 including three tunable semiconductor lasers 100A, 100B and 100C. Likewise, the silicon PIC may be one of a plurality of silicon PICs on a silicon wafer. FIG. 15B shows the III-V wafer 1000 together with a silicon wafer 2000 which comprises a plurality of silicon PICs each including a respective input waveguide 200A, 200B, 200C. While just three lasers and three silicon PICs are shown in FIG. 15B, it is to be understood that in some implementations each wafer may include hundreds of lasers or PICs.

Semiconductor lasers and silicon PICs may be mass produced at the wafer level in a cost effective manner. The method may thus comprise obtaining a III-V wafer 1000 including a plurality of lasers and a silicon wafer 2000 including a plurality of silicon PICs and simultaneously aligning each respective semiconductor laser 100A, 100B, 100C with a respective input waveguide 200A, 200B, 200C. By aligning and bonding the III-V semiconductor lasers and silicon PICs together at the wafer level, the process may be quicker and more efficient.

Referring again to FIG. 15B, the silicon wafer 2000 may include a silicon substrate 2010 and an optically isolating layer 2020, such as silicon dioxide, overlying at least a part of the silicon substrate. The input waveguides 200A, 200B, 200C may be positioned over the oxide layer. For example the input waveguides may have formed from a silicon layer and polymer layer overlying the oxide layer. The input waveguides 200A, 200B, 200C may be mode converters comprising a relatively large cladding layer of low refractive index material 201A such as a polymer or SiO2, covering a tapered silicon core 202A. Relatively large means that the width and height of the cladding layer 201A is at least twice the width and height of the silicon core 202A at the tallest and widest section of the silicon core 202A. The silicon core is tapered such that its width decreases in the direction towards a section of the silicon substrate including bondpads 210A-210C where the laser array 1000 may be mounted (as discussed below).

Further photonic components may be formed in each silicon PIC. In the example of FIG. 15B, a plurality of ring resonators 230A, 230B, 230C are formed in the silicon wafer and each ring resonator is connected to a respective one of the input waveguides. In other examples there could be other photonic components in PICs of the silicon wafer such as optical switches, photodetectors, arrayed waveguide gratings, optical couplers, further waveguides etc. In the example of FIG. 15B, the ring resonators are formed in a layer 2030 which may overlie the oxide layer 2010. The layer 2030 may be an optically isolating layer, such as silicon dioxide. The ring resonators, or other photonic components in the layer 2030 may be formed from silicon and patterned in the layer 2030 using semiconductor manufacturing techniques.

The silicon substrate may include a portion which extends beyond one end of the input waveguide. For example, the overlying silicon and silicon oxide layers may be etched away to expose the silicon substrate 2010. Metal bond pads 210A, 210B, 210C may be provided on this part of the silicon substrate. These bond pads may form electrical contacts to connect with the electrical contacts of the lasers and may assist self-alignment of the lasers 100A, 100B, 100C with the input waveguides 200A, 200B, 200C.

The method may include mounting the III-V wafer including the lasers to the silicon wafer including silicon PICs. For example, the III-V wafer 1000 may be flipped over and attached to the silicon wafer 2000 as shown by the arrow in FIG. 15B. As part of this process, the lasers may be passively aligned with respective input waveguides of the silicon wafer. The passive alignment method may include aligning a bond pad of the semiconductor laser with a bond pad of the silicon substrate.

For example, a first bond pad 211 of the silicon wafer may be aligned with and bonded to the bondpad of the first gain section of the laser (e.g. 13 shown in FIG. 3A), a second pad 212 may be aligned with and bonded to a bondpad of the second gain section of the laser (e.g. 23 in FIG. 2), a third bondpad 213 may be aligned with and bonded to a bondpad of the optical coupler (e.g. 33 in FIG. 2) and a bond pad pair 214 may be aligned with and bonded to bondpads of the amplitude modulator (e.g. 28 and 29 shown in FIG. 2). While, in the illustrated examples the bond pad of each laser directly overlies the gain section of the laser, in other examples, an electrical redistribution layer may be formed on the III-V wafer to form large bond pads away from the active devices which the bond pads are to control (i.e. away from the gain sections and/or amplitude modulator). Mechanical bond pads may also be included to increase the solder reflow self-alignment force.

The bondpads of the silicon wafer may have been formed as part of the lithographic manufacturing process of the silicon wafer and so the position of these bond pads may be specified precisely with respect to the input waveguides 200A, 200B, 200C of the silicon wafer 1000. Therefore, bonding the lasers to respective bondpads of the silicon wafer may passively align the lasers with the respective input waveguides.

Figure 15C:
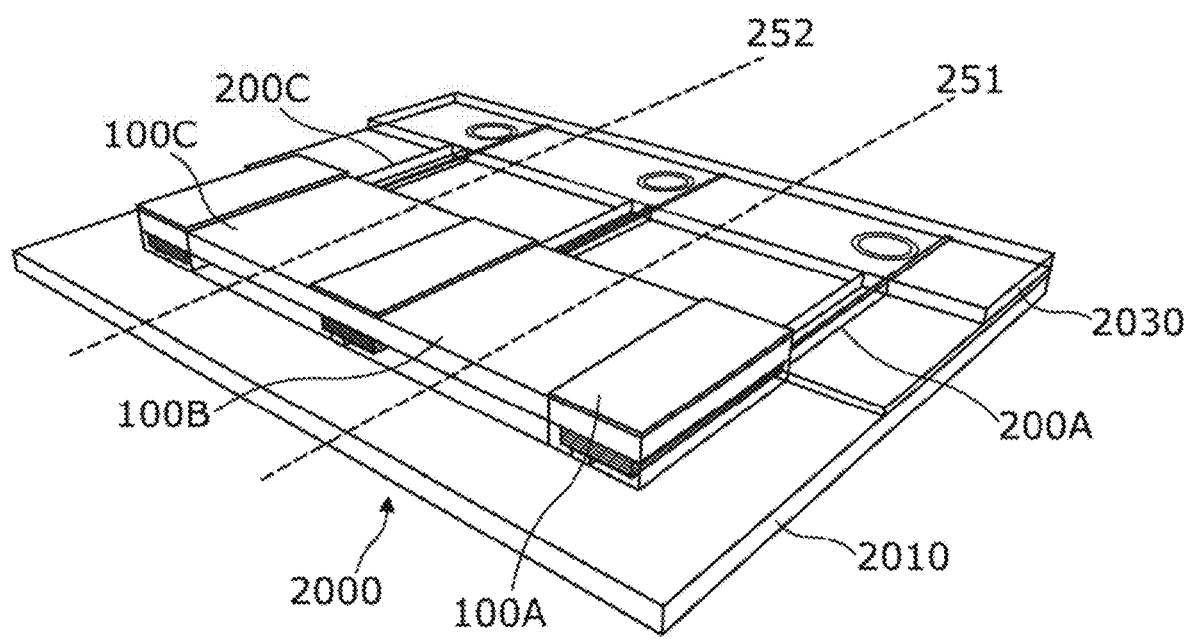
FIG. 15C is a perspective view of an example assembly comprising the III-V semiconductor wafer of FIG. 13A bonded to a silicon photonics wafer.

In other words, each III-V semiconductor laser may be aligned and secured in place relative to a respective input waveguide, e.g. by solder bonding the bond pad of the semiconductor laser to a bond pad of the silicon substrate. The result is shown in FIG. 15C, which depicts a hybrid assembly comprising the silicon wafer and III-V wafer of FIG. 15B after they have been aligned and bonded together. The assembly may then be cut and separated into a plurality of dies, e.g. by cutting along the dashed lines 251, 252 shown in FIG. 15C. In other examples, the silicon wafer and the III-V wafer may be cut into individual laser and silicon photonic chip dies first and then the lasers and waveguides may be aligned individually.

The optical mode in the input waveguide 202A is tightly confined, for example by the cladding layer 201A above and to the sides and by the optically isolating layer 2020 below. However, as the tapered section of the silicon core 202A narrows as it approaches the laser 100A mounted on bond pads 210A, the optical mode expands into the surrounding low refractive index material of the cladding 201A. This helps to ensure optical mode matching between the third or fourth waveguide 40 or 50 of the laser and the mode converting waveguide 200A. Likewise for the mode converters 200B, 200C and their respective lasers. An anti-reflection coating may be applied to the end face of the input waveguide to improve the coupling loss between the III-V laser and the input waveguide. The end face of the input waveguide is the end of the input waveguide which is butt coupled to the output of the III-V laser.

All of the features disclosed in this specification (including any accompanying claims, abstract and drawings), and/or all of the blocks of any method or process so disclosed, may be combined in any combination, except combinations where at least some of such features and/or blocks are mutually exclusive. Furthermore, except where explicitly stated otherwise or where the context or logic demands otherwise, the processes described herein may be carried out in any order and are not limited to the specific order shown in the particular examples. Some the processes or method blocks described herein may be carried contemporaneously with each other.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example of a generic series of equivalent or similar features.

What is claimed is:

1. A tunable laser comprising:
    a first waveguide comprising a first III-V semiconductor material and including a first gain section;
    a second waveguide comprising a second III-V semiconductor material and including a second gain section;
    an optical coupler to couple light between the first waveguide and the second waveguide;
    wherein the first waveguide overlies and is optically coupled to a third waveguide, the third waveguide comprising alternating layers of third and fifth III-V semiconductor materials, said third III-V semiconductor material having a refractive index which is higher than a refractive index of the fifth III-V semiconductor material;
    wherein the second waveguide overlies and is optically coupled to a fourth waveguide which comprises alternating layers of fourth and sixth III-V semiconductor materials, wherein the fourth III-V semiconductor material has a refractive index which is higher than a refractive index of the sixth III-V semiconductor material; and
    wherein a first laser cavity is formed between the optical coupler and a reflector of the third waveguide and a second laser cavity is formed between the optical coupler and a reflector of the fourth waveguide.

2. The tunable laser of claim 1 wherein the first laser cavity has a free spectral range (FSR) which is different to a FSR of the second laser cavity and wherein a resonance wavelength of at least one of the first laser cavity and the second laser cavity is tunable to provide wavelength tuning of the tunable laser via the Vernier effect.

3. The tunable laser of claim 1 wherein the first waveguide has a different length to the second waveguide.

4. A method of manufacturing a hybrid photonics assembly, the method including:
    obtaining a III-V semiconductor laser comprising a first waveguide and a mode converter to convert a mode of light travelling in the first waveguide, the first waveguide formed of III-V semiconductor materials and including a first gain section, the mode converter comprising a taper transition tip at an end of the first waveguide and a diluted waveguide at least partially underlying the first waveguide; the diluted waveguide formed of III-V semiconductor materials and having a width which is greater than a width of the gain section of the first waveguide; a first end of the first waveguide forming a first end of a laser cavity and a second end of the first waveguide comprising said taper transition tip which is to couple light from the first waveguide to the diluted waveguide, an end of the diluted waveguide remote from the first end of the first waveguide comprising a reflector that forms a second end of the laser cavity and an output of the III-V semiconductor laser;

obtaining a silicon photonic integrated circuit (PIC) including an input waveguide;

aligning the output of the III-V semiconductor laser with the input waveguide on the silicon PIC using a passive alignment method; and securing the aligned III-V semiconductor laser in place relative to the input waveguide.

5. The method of claim 4 wherein the III-V semiconductor laser is one of a plurality of III-V semiconductor lasers formed on a III-V semiconductor wafer and the silicon PIC is one of a plurality of silicon PICs formed on a silicon wafer or on a silicon on insulator wafer, each silicon PIC including a respective input waveguide; and wherein the method comprises simultaneously aligning each respective semiconductor laser with a respective input waveguide.

6. The method of claim 4 wherein the input waveguide is a mode converter which comprises a silicon core in a cladding which has a lower refractive index than the silicon core, wherein the cladding has a width closer to the width of the diluted waveguide than the first waveguide; and wherein the silicon core includes a tapered section having a width that reduces in the direction towards the tunable laser.

7. The method of claim 4 wherein a silicon substrate extends beyond one end of the input waveguide and wherein the passive alignment method includes aligning a bond pad of the semiconductor laser with a bond pad of the silicon substrate.

8. The method of claim 7 wherein securing the aligned III-V semiconductor laser in place relative to the input waveguide includes solder bonding the bond pad of the semiconductor laser to the bond pad of the silicon substrate.

* * * * *